(12) United States Patent
Ishiwata

(10) Patent No.: US 7,855,860 B2
(45) Date of Patent: Dec. 21, 2010

(54) MAGNETORESISTANCE ELEMENT MAGNETIC RANDOM ACCESS MEMORY, MAGNETIC HEAD AND MAGNETIC STORAGE DEVICE

(75) Inventor: Nobuyuki Ishiwata, Tokyo (JP)

(73) Assignee: NEC Corporation, Tokyo (JP)

( * ) Notice: Subject to any disclaimer, the term of this patent is extended or adjusted under 35 U.S.C. 154(b) by 1013 days.

(21) Appl. No.: 11/632,387

(22) PCT Filed: Jun. 30, 2005

(86) PCT No.: PCT/JP2005/012081

§ 371 (c)(1),
(2), (4) Date: Jan. 12, 2007

(87) PCT Pub. No.: WO2006/006420

PCT Pub. Date: Jan. 19, 2006

(65) Prior Publication Data

US 2008/0074799 A1    Mar. 27, 2008

(30) Foreign Application Priority Data

Jul. 12, 2004    (JP) .............................. 2004-205192

(51) Int. Cl.
*G11B 5/39*    (2006.01)
*G11C 11/02*    (2006.01)
(52) U.S. Cl. .................. 360/324.11; 365/158
(58) Field of Classification Search ...... 360/324–324.2; 257/421; 365/158, 171, 173
See application file for complete search history.

(56) References Cited

U.S. PATENT DOCUMENTS 4,748,089 A * 5/1988 Kumasaka et al. .......... 428/635

7,304,359 B2 * 12/2007 Kim et al. ................... 257/421
2006/0202290 A1 * 9/2006 Kim et al. ................... 257/421
2008/0273380 A1 * 11/2008 Diao et al. .................. 365/171

FOREIGN PATENT DOCUMENTS

| JP | 9-23031 | 1/1997 |
| JP | 2000-173022 | 6/2000 |
| JP | 2001-6932 | 1/2001 |

(Continued)

OTHER PUBLICATIONS

English Machine Translation of JP 2000-173022 A to Watanabe et al. published on Jun. 23, 2000.*

(Continued)

*Primary Examiner*—William J Klimowicz
(74) *Attorney, Agent, or Firm*—Scully, Scott, Murphy & Presser, P.C.

(57) ABSTRACT

A magnetoresistance element includes an antiferromagnetic layer, a fixed ferromagnetic layer, a first nonmagnetic layer and a free ferromagnetic layer. The antiferromagnetic layer is formed on the upper surface side of a substrate. The fixed ferromagnetic layer is formed on the antiferromagnetic layer. The first nonmagnetic layer is formed on the fixed ferromagnetic layer. The free ferromagnetic layer is formed on the first nonmagnetic layer. The fixed ferromagnetic layer is provided with an amorphous layer. The amorphous layer contains amorphous material having a composition expressed by a chemical formula of X—Y—N. X is an element selected from Co, Fe and Ni. Y is an element selected from Al, Si, Mg, Ta, Nb, Zr, Hf, W, Mo, Ti and V. N represents nitrogen.

14 Claims, 20 Drawing Sheets

FOREIGN PATENT DOCUMENTS

| | | |
|---|---|---|
| JP | 2001-236607 A | 8/2001 |
| JP | 2001-352112 | 12/2001 |
| JP | 2002-150514 | 5/2002 |
| JP | 2002-158381 | 5/2002 |
| JP | 2004-22599 | 1/2004 |
| JP | 2004-47583 | 2/2004 |
| JP | 2004-158856 | 6/2004 |
| WO | WO03/090290 A | 10/2003 |

OTHER PUBLICATIONS

"40% tunneling magnetoresistance after anneal at 380° C. for tunnel junctions with iron – oxide interface layers", Zongzhi Zhang, S. Cardoso, P. P. Freitas, X. Batlle, P. Wei, N. Barradas, and J. C. Soares, J. Appl. Phys., 89 (2001) p. 6665.

"Improved Thermal Stability of Ferromagnetic Tunnel Junction With a CoFe / CoFeOx / CoFe Pinned Layer", T. Ochiai, N. Tezuka, K. Inomata, S. Sugimoto, and Y. Saito, Journal of Magnetic Society of Japan, vol. 27, No. 4 (2003), p. 307.

\* cited by examiner

Fig. 23

| | LOWER ELECTRODE LAYER 5 | FOUNDATION LAYER 6 | ANTIFERROMAGNETIC LAYER 4 | FERROMAGNETIC LAYER 3 | NONMAGNETIC LAYER 2 | FERROMAGNETIC LAYER 1 | UPPER ELECTRODE LAYER 7 | MR RATIO AFTER HEAT TREATMENT AT 350°C | STRUCTURE |
|---|---|---|---|---|---|---|---|---|---|
| 1 COMPARATIVE EXAMPLE | Ta(20) | NiFeCr(3) | PtMn(15) | Co90Fe10(3) | Al-O(1.3) | NiFe(5) | Ta(20) | 10 | |
| 2 PRESENT INVENTION | Ta(20) | NiFeCr(3) | PtMn(15) | Co84Fe97Ta2N5(3) | Al-O(1.3) | NiFe(5) | Ta(20) | 34 | |
| 3 PRESENT INVENTION | Ta(20) | NiFeCr(3) | PtMn(15) | Co80Fe8Ta5N7(3) | Al-O(1.3) | NiFe(5) | Ta(20) | 38 | |
| 4 PRESENT INVENTION | Ta(20) | NiFeCr(3) | PtMn(15) | Co70Fe8Ta10N13(3) | Al-O(1.3) | NiFe(5) | Ta(20) | 42 | |
| 5 PRESENT INVENTION | Ta(20) | NiFeCr(3) | PtMn(15) | Co77Fe8Ta13N2(3) | Al-O(1.3) | NiFe(5) | Ta(20) | 42 | |
| 6 PRESENT INVENTION | Ta(20) | NiFeCr(3) | PtMn(15) | Co70Fe7Ta13N10(3) | Al-O(1.3) | NiFe(5) | Ta(20) | 43 | |
| 7 PRESENT INVENTION | Ta(20) | NiFeCr(3) | PtMn(15) | Co66Fe7Ta15N12(3) | Al-O(1.3) | NiFe(5) | Ta(20) | 45 | |
| 8 PRESENT INVENTION | Ta(20) | NiFeCr(3) | PtMn(15) | Co50Fe6Ta15N29(3) | Al-O(1.3) | NiFe(5) | Ta(20) | 45 | |
| 9 PRESENT INVENTION | Ta(20) | NiFeCr(3) | PtMn(15) | Co70Fe8Ta11N11(3) | Al-O(1.3) | NiFe(5) | Ta(20) | 43 | |
| 10 PRESENT INVENTION | Ta(20) | NiFeCr(3) | PtMn(15) | Co59Fe6Ta15N20(3) | Al-O(1.3) | NiFe(5) | Ta(20) | 44 | |
| 11 PRESENT INVENTION | Ta(20) | NiFeCr(3) | PtMn(15) | Co61Fe7Ta22N10(3) | Al-O(1.3) | NiFe(5) | Ta(20) | 44 | |
| 12 PRESENT INVENTION | Ta(20) | NiFeCr(3) | PtMn(15) | Co50Fe5Ta20N25(3) | Al-O(1.3) | NiFe(5) | Ta(20) | 46 | |
| 13 PRESENT INVENTION | Ta(20) | NiFeCr(3) | PtMn(15) | Co67Fe8Ta22N3(3) | Al-O(1.3) | NiFe(5) | Ta(20) | 44 | |
| 14 PRESENT INVENTION | Ta(20) | NiFeCr(3) | PtMn(15) | Co36Fe4Ta30N30(3) | Al-O(1.3) | NiFe(5) | Ta(20) | 45 | |
| 15 PRESENT INVENTION | Ta(20) | NiFeCr(3) | PtMn(15) | Co70Fe7Ta11B12(3) | Al-O(1.3) | NiFe(5) | Ta(20) | 43 | |
| 16 PRESENT INVENTION | Ta(20) | NiFeCr(3) | PtMn(15) | Co70Fe7Ta10C13(3) | Al-O(1.3) | NiFe(5) | Ta(20) | 42 | |
| 17 PRESENT INVENTION | Ta(20) | NiFeCr(3) | PtMn(15) | Co69Fe7Zr11N13(3) | Al-O(1.3) | NiFe(5) | Ta(20) | 45 | |
| 18 PRESENT INVENTION | Ta(20) | NiFeCr(3) | PtMn(15) | Co68Fe7Al15N20(3) | Al-O(1.3) | NiFe(5) | Ta(20) | 45 | |
| 19 PRESENT INVENTION | Ta(20) | NiFeCr(3) | PtMn(15) | Co63Fe7Si13N17(3) | Al-O(1.3) | NiFe(5) | Ta(20) | 44 | |
| 20 PRESENT INVENTION | Ta(20) | NiFeCr(3) | PtMn(15) | Co63Fe7Mg14B16(3) | Al-O(1.3) | NiFe(5) | Ta(20) | 44 | |
| 21 PRESENT INVENTION | Ta(20) | NiFeCr(3) | PtMn(15) | Co64Fe7Nb15C14(3) | Al-O(1.3) | NiFe(5) | Ta(20) | 45 | |
| 22 PRESENT INVENTION | Ta(20) | NiFeCr(3) | PtMn(15) | Co68Fe7Hf11C14(3) | Al-O(1.3) | NiFe(5) | Ta(20) | 45 | |
| 23 PRESENT INVENTION | Ta(20) | NiFeCr(3) | PtMn(15) | Co65Fe7W14N14(3) | Al-O(1.3) | NiFe(5) | Ta(20) | 46 | FIG. 9 |
| 24 PRESENT INVENTION | Ta(20) | NiFeCr(3) | PtMn(15) | Co66Fe7Mo13B14(3) | Al-O(1.3) | NiFe(5) | Ta(20) | 43 | FIG. 9 |
| 25 PRESENT INVENTION | Ta(20) | NiFeCr(3) | PtMn(15) | Co65Fe6Ti16B13(3) | Al-O(1.3) | NiFe(5) | Ta(20) | 43 | FIG. 9 |
| 26 PRESENT INVENTION | Ta(20) | NiFeCr(3) | PtMn(15) | Co66Fe8V13C13(3) | Al-O(1.3) | NiFe(5) | Ta(20) | 42 | FIG. 9 |
| 27 PRESENT INVENTION | Ta(20) | NiFeCr(3) | PtMn(15) | Co73Ta12N15(3) | Al-O(1.3) | NiFe(5) | Ta(20) | 45 | FIG. 9 |
| 28 PRESENT INVENTION | Ta(20) | NiFeCr(3) | PtMn(15) | Fe74Ta11N15(3) | Al-O(1.3) | NiFe(5) | Ta(20) | 43 | FIG. 9 |
| 29 PRESENT INVENTION | Ta(20) | NiFeCr(3) | PtMn(15) | Ni75Ta11N14(3) | Al-O(1.3) | NiFe(5) | Ta(20) | 41 | FIG. 9 |
| 30 COMPARATIVE EXAMPLE | TiN(30) | NiFeCr(3) | PtMn(15) | Co90Fe10(3) | Al-O(1.3) | NiFe(5) | Ta(20) | 9 | |
| 31 PRESENT INVENTION | TiN(30) | NiFeCr(3) | PtMn(15) | Co66Fe7Ta15N12(3) | Al-O(1.3) | NiFe(5) | Ta(20) | 45 | |
| 32 COMPARATIVE EXAMPLE | TiN(30) | NiFe(4) | IrMn(10) | Co90Fe10(3) | Al-O(1.3) | NiFe(5) | Ta(20) | 5 | |
| 33 PRESENT INVENTION | TiN(30) | NiFe(4) | IrMn(10) | Co66Fe7Ta15N12(3) | Al-O(1.3) | NiFe(5) | Ta(20) | 40 | |
| 34 COMPARATIVE EXAMPLE | TiN(30) | NiCr(3) | NiMn(20) | Co90Fe10(3) | Al-N(1.2) | NiFe(5) | Ta(20) | 11 | |
| 35 PRESENT INVENTION | TiN(30) | NiCr(3) | NiMn(20) | Co67Fe7Ta13N13(3) | Al-N(1.2) | NiFe(5) | Ta(20) | 44 | |
| 36 COMPARATIVE EXAMPLE | TiN(30) | NiFeCr(3) | PtMn(15) | Co90Fe10(3) | Al-O(1.3) | CoFe(5) | Ta(20) | 9 | |
| 37 PRESENT INVENTION | TiN(30) | NiFeCr(3) | PtMn(15) | Co70Fe8Ta10N12(3) | Al-O(1.3) | CoFe(5) | Ta(20) | 50 | |
| 38 COMPARATIVE EXAMPLE | TiN(30) | NiFeCr(3) | PtMn(15) | Co90Fe10(3) | Al-O(1.3) | CoFe(5) | TiN(30) | 10 | |
| 39 PRESENT INVENTION | TiN(30) | NiFeCr(3) | PtMn(15) | Co70Fe8Ta10N12(3) | Al-O(1.3) | NiFe(5) | TiN(30) | 51 | |
| 40 COMPARATIVE EXAMPLE | Ta(20) | Ta(5) | PtMn(15) | Co90Fe10(3) | Al-O(1.3) | NiFe(5) | Ta(20) | 9 | |
| 41 PRESENT INVENTION | Ta(20) | Ta(5) | PtMn(15) | Co66Fe6Ta15N12(3) | Al-O(1.3) | NiFe(5) | Ta(20) | 45 | |

Fig. 24

| | | LOWER ELECTRODE LAYER 6 | FOUNDATION LAYER 5 | ANTIFERROMAGNETIC LAYER 4 | FERROMAGNETIC LAYER 3 | NONMAGNETIC LAYER 2 | FERROMAGNETIC LAYER 1 | UPPER ELECTRODE LAYER 7 | ULTIMATE PRESSURE | SPUTTERING PRESSURE | MR RATIO AFTER HEAT TREATMENT AT 350 °C | STRUCTURE |
|---|---|---|---|---|---|---|---|---|---|---|---|---|
| 1 | COMPARATIVE EXAMPLE | Ta(20) | NiFeCr(3) | PtMn(15) | Co70Fe7Ta10Ni13(3) | Al-O(1.3) | NiFe(5) | Ta(20) | 3×10-7 | 0.3 | 45 | - |
| 2 | PRESENT INVENTION | Ta(20) | NiFeCr(3) | PtMn(15) | Co70Fe7Ta10Ni13(3) | Al-O(1.3) | NiFe(5) | Ta(20) | 7×10-7 | 0.3 | 42 | FIG. 9 |
| 3 | PRESENT INVENTION | Ta(20) | NiFeCr(3) | PtMn(15) | Co70Fe7Ta10Ni13(3) | Al-O(1.3) | NiFe(5) | Ta(20) | 1×10-6 | 0.3 | 43 | FIG. 9 |
| 4 | PRESENT INVENTION | Ta(20) | NiFeCr(3) | PtMn(15) | Co70Fe7Ta10Ni13(3) | Al-O(1.3) | NiFe(5) | Ta(20) | 3×10-6 | 0.3 | 38 | FIG. 9 |
| 5 | PRESENT INVENTION | Ta(20) | NiFeCr(3) | PtMn(15) | Co70Fe7Ta10Ni13(3) | Al-O(1.3) | NiFe(5) | Ta(20) | 5×10-6 | 0.3 | 19 | FIG. 9 |
| 6 | COMPARATIVE EXAMPLE | Ta(20) | NiFeCr(3) | PtMn(15) | Co70Fe7Ta10Ni13(3) | Al-O(1.3) | NiFe(5) | Ta(20) | 1×10-5 | 0.3 | 12 | - |
| 7 | PRESENT INVENTION | Ta(20) | NiFeCr(3) | PtMn(15) | Co62Fe81a17Ni13(3) | Al-O(1.3) | NiFe(5) | Ta(20) | 7×10-7 | 0.1 | 44 | - |
| 8 | PRESENT INVENTION | Ta(20) | NiFeCr(3) | PtMn(15) | Co62Fe81a16Ni14(3) | Al-O(1.3) | NiFe(5) | Ta(20) | 7×10-7 | 0.7 | 45 | FIG. 9 |
| 9 | PRESENT INVENTION | Ta(20) | NiFeCr(3) | PtMn(15) | Co62Fe81a18Ni13(3) | Al-O(1.3) | NiFe(5) | Ta(20) | 7×10-7 | 1 | 43 | FIG. 9 |
| 10 | PRESENT INVENTION | Ta(20) | NiFeCr(3) | PtMn(15) | Co61Fe81a17Ni14(3) | Al-O(1.3) | NiFe(5) | Ta(20) | 7×10-7 | 3 | 39 | FIG. 9 |
| 11 | COMPARATIVE EXAMPLE | Ta(20) | NiFeCr(3) | PtMn(15) | Co60Fe71a17Ni15(3) | Al-O(1.3) | NiFe(5) | Ta(20) | 7×10-7 | 5 | 20 | - |
| 12 | COMPARATIVE EXAMPLE | Ta(20) | NiFeCr(3) | PtMn(15) | Co61Fe81a17Ni14(3) | Al-O(1.3) | NiFe(5) | Ta(20) | 7×10-7 | 10 | 14 | - |
| 13 | PRESENT INVENTION | Ta(20) | NiFeCr(3) | PtMn(15) | Co70Fe7Ta10Ni13(3) | Al-O(1.3) | NiFe(5) | Ta(20) | 5×10-7 | 0.3 | 45 | FIG. 9 |
| 14 | PRESENT INVENTION | Ta(20) | NiFeCr(3) | PtMn(15) | Co70Fe7Ta11Ni12(3) | Al-O(1.3) | NiFe(5) | Ta(20) | 5×10-7 | 0.7 | 42 | FIG. 9 |
| 15 | PRESENT INVENTION | Ta(20) | NiFeCr(3) | PtMn(15) | Co70Fe7Ta9Ni14(3) | Al-O(1.3) | NiFe(5) | Ta(20) | 5×10-7 | 1 | 43 | FIG. 9 |
| 16 | PRESENT INVENTION | Ta(20) | NiFeCr(3) | PtMn(15) | Co69Fe7Ta10Ni14(3) | Al-O(1.3) | NiFe(5) | Ta(20) | 5×10-7 | 3 | 38 | FIG. 9 |
| 17 | COMPARATIVE EXAMPLE | Ta(20) | NiFeCr(3) | PtMn(15) | Co71Fe7Zr9Ni13(3) | Al-O(1.3) | NiFe(5) | Ta(20) | 5×10-7 | 5 | 17 | - |
| 18 | COMPARATIVE EXAMPLE | Ta(20) | NiFeCr(3) | PtMn(15) | Co68Fe7Ta12Ni13(3) | Al-O(1.3) | NiFe(5) | Ta(20) | 5×10-7 | 10 | 8 | - |

Fig. 25

| | LOWER ELECTRODE LAYER 6 | FOUNDATION LAYER 5 | ANTIFERROMAGNETIC LAYER 4 | FERROMAGNETIC LAYER 3 | NONMAGNETIC LAYER 2 | FERROMAGNETIC LAYER 1 | UPPER ELECTRODE LAYER 7 | MR RATIO AFTER HEAT TREATMENT AT 350 °C (%) | STRUCTURE |
|---|---|---|---|---|---|---|---|---|---|
| 1 COMPARATIVE EXAMPLE | Ta(20) | NiFeCr(3) | PtMn(15) | Co90Fe10(3) | Al-O(1.3) | NiFe(5) | Ta(20) | 10 | — |
| 2 PRESENT INVENTION | Ta(20) | NiFeCr(3) | PtMn(15) | Co68Fe8Zr12B12(3)/Co90Fe10(3) | Al-O(1.3) | NiFe(5) | Ta(20) | 46 | FIG. 10 |
| 3 PRESENT INVENTION | Ta(20) | NiFeCr(3) | PtMn(15) | Co54Fe6Zr18B22(3)/Co90Fe10(3) | Al-O(1.3) | NiFe(5) | Ta(20) | 45 | FIG. 10 |
| 4 PRESENT INVENTION | Ta(20) | NiFeCr(3) | PtMn(15) | Co90Fe10(3)/Co68Fe8Zr12B12(3) | Al-O(1.3) | NiFe(5) | Ta(20) | 43 | FIG. 11 |
| 5 COMPARATIVE EXAMPLE | Ta(20) | NiFeCr(3) | PtMn(15) | Co90Fe10(3)/Co54Fe6Zr18B22(3) | Al-O(1.3) | NiFe(5) | Ta(20) | 44 | FIG. 11 |
| 6 COMPARATIVE EXAMPLE | Ta(20) | NiFeCr(3) | PtMn(15) | Co90Fe10(3)/Co68Fe8Zr12B12(3)/Co90Fe10(3) | Al-O(1.3) | NiFe(5) | Ta(20) | 45 | FIG. 12 |
| 7 PRESENT INVENTION | Ta(20) | NiFeCr(3) | PtMn(15) | Co90Fe10(3)/Co54Fe6Zr18B22(3)/Co90Fe10(3) | Al-O(1.3) | NiFe(5) | Ta(20) | 46 | FIG. 12 |
| 8 PRESENT INVENTION | Ta(20) | NiFeCr(3) | PtMn(15) | Co68Fe8Zr12B12(3)/Co90Fe10(3)/Co69Fe8Zr12B12(3) | Al-O(1.3) | NiFe(5) | Ta(20) | 43 | FIG. 13 |
| 9 PRESENT INVENTION | Ta(20) | NiFeCr(3) | PtMn(15) | Co54Fe6Zr18B22(3)/Co90Fe10(3)/Co54Fe6Zr18B22(3) | Al-O(1.3) | NiFe(5) | Ta(20) | 42 | FIG. 13 |

Fig. 26

| | LOWER ELECTRODE LAYER 6 | FOUNDATION LAYER 5 | ANTIFERROMAGNETIC LAYER 4 | FERROMAGNETIC LAYER 3 | NONMAGNETIC LAYER 2 | FERROMAGNETIC LAYER 1 | UPPER ELECTRODE LAYER 7 | MR RATIO AFTER HEAT TREATMENT AT 350 °C | STRUCTURE |
|---|---|---|---|---|---|---|---|---|---|
| 1 COMPARATIVE EXAMPLE | Ta(20) | NiFeCr(3) | PtMn(15) | Co90Fe10(3)/Ru(0.8)/Co90Fe10(3) | Al-O(1.3) | NiFe(5) | Ta(20) | 12 | — |
| 2 PRESENT INVENTION | Ta(20) | NiFeCr(3) | PtMn(15) | Co68Fe8Zr12B12(3)/Ru(0.8)/Co90Fe10(3) | Al-O(1.3) | NiFe(5) | Ta(20) | 46 | FIG. 14 |
| 3 PRESENT INVENTION | Ta(20) | NiFeCr(3) | PtMn(15) | Co54Fe6Zr18B22(3)/Ru/Co90Fe10(3) | Al-O(1.3) | NiFe(5) | Ta(20) | 46 | FIG. 14 |
| 4 PRESENT INVENTION | Ta(20) | NiFeCr(3) | PtMn(15) | Co90Fe10(3)/Ru(0.8)/Co68Fe8Zr12B12(3) | Al-O(1.3) | NiFe(5) | Ta(20) | 44 | FIG. 15 |
| 5 COMPARATIVE EXAMPLE | Ta(20) | NiFeCr(3) | PtMn(15) | Co90Fe10(3)/Ru(0.8)/Co54Fe6Zr18B22(3) | Al-O(1.3) | NiFe(5) | Ta(20) | 43 | FIG. 15 |
| 6 COMPARATIVE EXAMPLE | Ta(20) | NiFeCr(3) | PtMn(15) | Co68Fe8Ta12N13(3)/Ru(0.8)/Co90Fe10(3) | Al-O(1.3) | NiFe(5) | Ta(20) | 46 | FIG. 16 |
| 7 PRESENT INVENTION | Ta(20) | NiFeCr(3) | PtMn(15) | Co67Fe8Ta12N13(3)/Ru(0.8)/Co90Fe10 | Al-O(1.3) | NiFe(5) | Ta(20) | 46 | FIG. 16 |
| 8 PRESENT INVENTION | Ta(20) | NiFeCr(3) | PtMn(15) | Co68Fe8Hf11N13(3)/Co90Fe10(3)/Ru80.8)/Co90Fe10 | Al-O(1.3) | NiFe(5) | Ta(20) | 45 | FIG. 16 |
| 9 PRESENT INVENTION | Ta(20) | NiFeCr(3) | PtMn(15) | Co54Fe6Zr18zB22(3)/Co90Fe10(3)/Ru/Co90Fe10 | Al-O(1.3) | NiFe(5) | Ta(20) | 46 | FIG. 16 |
| 8 PRESENT INVENTION | Ta(20) | NiFeCr(3) | PtMn(15) | Co90Fe10(3)/Ru(0.8)/Co68Fe8Zr12B12(3) | Al-O(1.3) | NiFe(5) | Ta(20) | 44 | FIG. 17 |
| 9 PRESENT INVENTION | Ta(20) | NiFeCr(3) | PtMn(15) | Co90Fe10(3)/Ru(0.8)/Co54Fe6Zr18B22(3) | Al-O(1.3) | NiFe(5) | Ta(20) | 43 | FIG. 17 |

MAGNETORESISTANCE ELEMENT MAGNETIC RANDOM ACCESS MEMORY, MAGNETIC HEAD AND MAGNETIC STORAGE DEVICE

TECHNICAL FIELD

The present invention relates to a magnetoresistance element, and a magnetic random access memory, a magnetic head and a magnetic storage device which incorporate the same.

BACKGROUND ART

Extensive development has been carried out to apply the magnetoresistance effect, which is based on the conduction phenomenon depending on the spin of electrons, to a magnetic head and a magnetic random access memory (MRAM) or the like. The magnetoresistance effect is a phenomenon that a film stack including the structure of a ferromagnetic layer, a nonmagnetic layer and another ferromagnetic layer exhibits a change in the resistance depending on the relative angle between the magnetization directions of the ferromagnetic layers, which are opposed to each other across the nonmagnetic layer. In general, the minimum resistance is obtained when the magnetization directions are parallel, and the maximum resistance is obtained when the magnetization directions are anti-parallel.

Among film stacks exhibiting such magnetoresistance effect (magnetoresistance film stack), those in which a conductive material such as Cu is used for the nonmagnetic layer is generally called a giant magnetoresistance (GMR) film stack. One sort of GMR film stack is designed to flow a current in plane of the film faces, which is referred to as CIP-GMR film stack (Current In Plain GMR film stack), and another sort of GMR film stack is designed to flow a current perpendicularly to the film faces, which is referred to as CPP-GMR film stack (Current Perpendicular to Plain GMR film stack) On the other hand, a magnetoresistance film stack in which an insulating material such as alumina is used as the nonmagnetic layer is called a tunneling magnetoresistance (TMR) film stack.

The nonmagnetic layer formed of alumina or the like is referred to as the tunnel barrier layer. In the TMR film stack, a larger magnetoresistance change ratio (MR ratio) is obtained as the increase of the spin polarizability in the magnetic layers, which are opposed across the nonmagnetic layer. Materials having a large spin polarizability include magnetic metals such as Fe, Co and Ni, magnetic metal alloys such as a Co—Fe alloy and a Ni—Fe alloy, and half metallic ferromagnetic materials, which are expected to achieve a spin polarization of 100%. The TMR film stack described above is expected as a magnetoresistance film stack to exhibit a larger MR ratio.

A magnetoresistance film stack classified as a spin valve type has been proposed in order to apply the magnetoresistance film stack such as the GMR and TMR film stack to devices operating on a micro-magnetic field. In a spin valve type magnetoresistance film stack, one of magnetic layers opposed across a nonmagnetic layer has a fixed magnetization direction, and the other has a magnetization direction freely reversible on an external magnetic field. The magnetic layer with the fixed magnetization is referred to as the fixed (ferro) magnetic layer (or the magnetization fixed layer), while the magnetic layer with the freely reversible magnetization is referred to as the free (ferro) magnetic layer (or the magnetization free layer). This architecture allows the relative angle between the magnetization directions of the fixed and free magnetic layers to be easily changed.

The fixed magnetic layer can be mainly realized by the following three approaches. A first approach is to use magnetic material having a coercive force larger than that of the free magnetic layer, so that the difference between the coercive forces of the free and fixed magnetic layers is used. A second approach is to laminate a magnetic layer that functions as the fixed magnetic layer with a permanent magnet film or the like having a large coercive force, so that the magnetization of the fixed layer is fixed by using a coupling magnetic field generated across the interface between these films. A third approach (an exchange coupling technique) is to laminate a magnetic film that functions as the fixed magnetic layer with an antiferromagnetic layer, so that magnetization of the fixed magnetic layer is fixed by an exchange coupling magnetic field generated across the interface between these films. The third approach has been already applied to magnetic heads in practical use with respect to the GMR film stack. On the basis of this actual achievement, the exchange-coupling-based approach is also expected to be applied to next-generation magnetic heads and MRAMs and so on, with respect to the spin valve type magnetoresistance film stack using the TMR film stack as well as that using the GMR film stack.

In the application to a magnetic head or an MRAM, the magnetoresistance film stack requires heat resistance against high temperature processes in the device manufacture. In the application to an MRAM, for example, the heat resistance against temperatures of 350° C. or higher is required. However, a heat treatment conducted at such a high temperature sometimes deteriorates the magnetoresistance characteristics and thereby decreases the MR ratio. It is considered that one cause of this deterioration is interdiffusion of elements of the film stack within the device.

FIG. 1 is a cross sectional view showing an example of the structure of the spin valve type TMR film adopting the exchange coupling as a magnetoresistance film. On a substrate 109 provided is a film structure of a Ta film of 30 nm as a lower electrode layer 106, an NiFe film of 3 nm as a foundation layer 105, a PtMn film of 15 nm as an antiferromagnetic layer 104, a three-layered film stack including a CoFe film of 3 nm, an Ru film of 0.8 nm and a CoFe film of 3 nm as a fixed ferromagnetic layer (magnetization fixed layer) 103, an aluminum oxide film of 1 nm as a nonmagnetic layer (tunnel barrier layer) 102, an NiFe film of 5 nm as a free ferromagnetic layer (magnetization free layer) 101, and a Ta film of 20 nm as an upper electrode layer 107, which are sequentially laminated from the side of the substrate 109 in this order.

FIG. 2 is a graph showing distribution of manganese in TMR film stacks subjected to heat treatment at 275° C. and 350° C., respectively. FIG. 2 shows the evaluation result using a secondary ion mass spectrometry (SIMS) technique. The manganese of the PtMn film, which functions as the antiferromagnetic layer 104, diffuses in accordance with the increase of the temperature in the heat treatment. In particular, accumulation of the manganese is observed in the vicinity of the nonmagnetic layer 102. It is probable that the accumulated manganese influences characteristics of the barrier and causes the decrease of the MR ratio. Accordingly, the suppression of the manganese diffusion is probably important to obtain the TMR film with high heat resistance.

An approach in which an iron oxide film (FeOx) is inserted between the nonmagnetic layer 102 and the fixed ferromagnetic layer 103 (CoFe) to suppress the manganese diffusion is disclosed in "40% tunneling magnetoresistance after anneal at 380° C. for tunnel junctions with iron & #8211; oxide interface layers", Zongzhi Zhang, S. Cardoso, P. P. Freitas, X. Batlle, P. Wei, N. Barradas, and J. C. Soares, J. Appl. Phys., 89 (2001) p. 6665. This document described that the disclosed approach achieves 40% MR ratio after heat treatment at 380° C. However, this approach suffers from an extremely narrow margin of heat treatment conditions for obtaining a large MR ratio has an, which prevents the increase of yield in manufacturing. Moreover, magnetic characteristics of iron oxide are largely changed by heat treatment. Since the fixed ferromagnetic layer has a stacked structure of an iron oxide film and a CoFe film, the intensity of magnetization is changed by heat treatment in the fixed ferromagnetic layer as a whole. The magnetization of the fixed ferromagnetic layer has an effect on the free ferromagnetic layer when the TMR film is patterned. For example, in the case of the MRAM, the effect on the free ferromagnetic layer caused by the magnetization of the fixed ferromagnetic layer generates offset in magnetization reversal characteristics of the free ferromagnetic layer. This offset constantly changes in the stack structure of the iron oxide film, which make it difficult to have a stable device operation.

The use of a CoFe/CoFeOx/CoFe structure, in which a CoFeOx layer is inserted between CoFe layers of a fixed ferromagnetic layer, is also disclosed in "Improved Thermal Stability of Ferromagnetic Tunnel Junction With a CoFe/CoFeOx/CoFe Pinned Layer", T. Ochiai, N. Tezuka, K. Inomata, S. Sugimoto, and Y. Saito, Journal of Magnetic Society of Japan, vol. 27, No. 4 (2003), p. 307. This document describes that the disclosed approach achieves a maximum MR ratio of 47% after heat treatment at 350° C. However, it is pointed out that the use of the CoFeOx layer suffers from oxygen diffusion after heat treatment even at a relatively low temperature. In other words, magnetic characteristics of the fixed ferromagnetic layer are changed at relatively low temperatures, making it difficult to achieve a stable device operation as is the case of the insertion of the FeOx layer described above.

As a related technique, Japanese Laid-Open Patent Application No. JP-A 2004-47583 discloses a magnetoresistance element, a magnetic memory, the magnetic head and a magnetic storage device. According to this conventional technique, the size of crystal grains of an antiferromagnetic layer and the thickness of a magnetization fixed layer are defined so as to suppress the effect of the manganese diffusion. That is, the size of crystal grains of an antiferromagnetic layer and the thickness of a magnetization fixed layer satisfies the following:

$1 \text{ nm} \leq D < 10 \text{ nm, and } D \geq 2 \times H \text{ or } H \geq 1.4 \times D$ or $D \geq 10 \text{ nm}$ where D is the average grain diameter of crystal grains of material of the antiferromagnetic layer, and H is the distance between the antiferromagnetic layer and a nonmagnetic layer (barrier layer).

FIG. 3 is a cross sectional view showing the structure of the TMR film in this conventional technique. When crystal grain boundaries are consecutively formed in the antiferromagnetic layer 104 and the fixed magnetic layer 103, it is difficult to obtain a remarkable effect of the heat resistance improvement even in the case that D and H are defined as described above, since diffusion is enhanced by grain boundaries 110.

In this conventional technique, disclosed further is a method in which a diffusion control layer 112 is inserted between the antiferromagnetic layer 104 and the nonmagnetic layer 102. FIG. 4 is a cross sectional view showing the structure of the TMR film stack in accordance with this conventional technique. The diffusion control layer 112 here contains a ferromagnetic material having a composition represented by a formula of M-X, where M represents at least one element selected from Fe, Co and Ni, and X represents at least one nonmagnetic element selected from the IVa group to VIIa group, the VIII group, the Ib group, lanthanoids, Al, Si, Sc, Y, Zn, Ga, Ge, B, C, N, O, P and S. In this case, the grain boundaries 110 are formed as shown in FIG. 4, and therefore the diffusion through the grain boundaries 110 are suppressed in comparison with FIG. 3.

FIGS. 5 to 7 are cross sectional views of the TMR film showing states of the Mn diffusion in this conventional technique. In this case, for example, progress of the diffusion of the manganese of the antiferromagnetic layer is observed as shown in FIG. 5, and manganese 111 is accumulated between the layers. The diffusion is temporarily suppressed here. Thereafter, however, the accumulated manganese 111 reaches the grain boundaries 110 within the upper layer. As shown in FIG. 6, the diffusion is then progressed to further upper layers through the grain boundaries 110 of the upper layer. Finally, the diffusion reaches the nonmagnetic layer 102 as shown in FIG. 7. That is, a problem occurs in which the MR ratio is sharply decreased after heat treatment over a certain heat treatment temperature or a certain heat treatment time. This problem particularly depends on the ultimate pressure, the substrate temperature, the sputtering gas pressure, and the sputtering power, which are conditions of the deposition of the respective layers through sputtering. When the sputtering gas pressure is increased from 0.1 Pa to 1 Pa, for example, the MR ratio is decreased even at a low heat treatment temperature of about 300° C. When the substrate temperature is increased up to 150° C., heat resistance is decreased in comparison with the case of film formation at the room temperature. This implies that strict control of film formation conditions is required in order to prepare the TMR film with excellent heat resistance, causing the decrease of manufacturing yield and the increase of manufacturing cost.

In addition, Japanese Laid-Open Patent Application No. JP-A2004-47583 discloses a case in which ferromagnetic material functioning as a grain boundary control layer and having a compound indicated by a formula of M-X is an amorphous structure. More specifically, the use of CoFeB and NiFeB is disclosed. These amorphous structure films, however suffer from not only a problem that grain boundaries are formed by crystallization in heat treatment at a high temperature, but also a problem that the diffusion of boron is observed in heat treatment at 300° C. or lower; the barrier characteristics are deteriorated by the diffusion of boron, instead of the diffusion of manganese of the antiferromagnetic layer.

Japanese Laid-Open Patent Application No. JP-A Heisei 9-23031 discloses a magnetoresistance film stack using a soft magnetic film, characterized in that crystal grains of an element X with an average crystal grain diameter of 20 nm or less is separated from carbide or nitride of an element M within the soft magnetic film having a compound of X-M-Z, where the element X represents one or two or more of elements selected from Fe, Co and Ni, and the element M represents one or two or more of elements selected from Ti, Zr, Hf, V, Nb, Ta, Mo and W, while the element Z represents one or two of elements selected from C and N. When crystal grains of the element X are separated from carbide or nitride of the element M, however, crystal grain boundaries exist therebetween, and this causes a problem that the Mn diffusion progresses through the crystal grain boundaries, and the MR ratio is sharply decreased after heat treatment over a certain heat treatment temperature or a certain heat treatment time.

There is a need of a magnetoresistance element which incorporates a heat-resistive magnetoresistance film stack which does not exhibit deterioration of characteristics after a heat treatment process at a temperature of 350° C. or higher. There is a need of a magnetoresistance element with high manufacturing yield and low manufacturing cost. There is a need of a magnetic random access memory, the magnetic head and the magnetic storage device that exhibit a high heat resistance, a high manufacturing yield and the low manufacturing cost.

As a related technique, a ferromagnetic tunnel junction element and a manufacturing method thereof are disclosed in Japanese Laid-Open Patent Application No. JP-A 2002-158381. This ferromagnetic tunnel junction element includes: an antiferromagnetic layer containing manganese; a magnetization fixed layer formed on the anti ferromagnetic layer in which a pair of first and second ferromagnetic layers are opposed across an insulating layer or an amorphous magnetic layer; a tunnel barrier layer formed on the magnetization fixed layer, and a magnetization free layer formed on the tunnel barrier layer. The insulating layer or the amorphous magnetic layer in the magnetization fixed layer may have a function of avoiding the diffusion of manganese contained in the antiferromagnetic layer. The insulating layer in the magnetization fixed layer may be formed through exposing the first ferromagnetic layer of the magnetization fixing layer in an oxidizing atmosphere, a nitriding atmosphere and a carbiding atmosphere.

As a related technique, a magnetoresistance type magnetic head and a magnetic recording/reproducing device are disclosed in Japanese Laid-Open Patent Application No. JP-A 2002-150514. In this magnetoresistance type magnetic head, an antiferromagnetic film, a fixed layer, a nonmagnetic film and a free layer are sequentially deposited. The fixed layer is provided with a ferromagnetic film with the magnetization direction fixed to an external magnetic field by exchange coupling with the antiferromagnetic film. The free layer is provided a ferromagnetic film in which the magnetization is rotated in accordance with the external magnetic field. The magnetoresistance effect is observed due to the change in the relative angle between the magnetizations of the ferromagnetic films within the fixed and free layers. In the fixed layer, an oxide film is formed between a pair of the ferromagnetic films. The film thickness of the oxide film is $5 \times 10^{-10}$ m or larger and $30 \times 10^{-10}$ m or less. The oxide film contains at least one element selected from Mg, Al, Si, Ca, Ti and Zr.

As a related technique, a magnetoresistance element and a magnetoresistance type head are disclosed in Japanese Laid-Open Patent Application No. JP-A 2001-352112. The magnetoresistance element is comprised of a film stack of an antiferromagnetic layer, a magnetic layer (fixed layer), a nonmagnetic layer, and a magnetic layer (free layer), which are sequentially laminated. The magnetization of the fixed layer is not easily rotated by the external magnetic field. The magnetization of the free layer is easily rotated by the external magnetic field. An oxide layer is formed within one of the antiferromagnetic layer, the fixed layer, the nonmagnetic layer and the free layer, or on the face of one of the antiferromagnetic layer, the fixed layer, the nonmagnetic layer and the free layer. In addition, an oxygen diffusion preventing layer is formed between the oxide layer and at least one of the layers (referred to as the other layer hereinafter) selected from the antiferromagnetic layer, the fixed layer, the nonmagnetic layer and the free layer in order to suppress oxidization of the said other layer. The oxygen diffusion preventing layer may mainly consist of at least one selected from Au, Pt, Ag, Ru, Ni and an alloy of $Ni_{1-x}M_x$ (where M represents more than one kind among Fe, Co, Cr and Ta, $0 \leq X \leq 40$, and X represents the atomic composition ratio). The oxide layer may be composed of oxide mainly consisting of an element D (D represents at least one kind of element selected from Al, Si, Ti, Ta, Fe, Co and Ni).

Japanese Laid-Open Patent Application No. JP-A 2001-236607 discloses a technique of a thin film magnetic head and a manufacturing method thereof. This thin film magnetic head includes a recording head. The recording head is formed by a read head, a lower magnetic core layer, an upper magnetic core layer, and a coil layer. The composition of the two magnetic core layers are expressed by a composition formula of $Fe_aMg_bNb_cO_d$ (subscripts a, b, c and d indicate atomic weight %). The composition is characterized by being composed of a soft magnetic material in a range of $a+b+c+d=100$, $45 \leq a \leq 85$, $5.5 \leq b \leq 28$, $0.5 \leq c \leq 3$ and $8 \leq d \leq 35$. Metal magnetic crystal grains with an average crystal grain diameter of 15 nm or less may be formed essentially by Fe, while the soft magnetic material forming a grain boundary product for substantially covering the metal magnetic crystal grains may be composed by Mg, Nb and O.

As a related technique, a magnetoresistance film and a magnetic read sensor using thereof are disclosed in Japanese Laid-Open Patent Application No. JP-A 2001-6932. This magnetoresistance film includes a regular antiferromagnetic layer, a fixed magnetic structure portion coupled thereto, a nonmagnetic conductive layer, and a free magnetic layer portion having at least one magnetic layer. The fixed magnetic structure portion includes a multilayer film structure including one or more pairs of a three-layer structure made of a first ferromagnetic layer, a nonmagnetic intermediate layer, and a second ferromagnetic layer, in which the first and second ferromagnetic layers are parallel or have a parallel component with each other in the magnetization direction.

DISCLOSURE OF INVENTION

Therefore, an object of the present invention is to provide a magnetoresistance element that has a magnetoresistance film stack with high heat resistance in which deterioration of characteristics is not observed after a heat treatment process in an element manufacturing process, a manufacturing method of such magnetoresistance element, a magnetic random access memory, a magnetic head and a magnetic storage device.

Another object of the present invention is to provide a magnetoresistance element that has a magnetoresistance film stack with high manufacturing yield and low manufacturing cost, a manufacturing method of the magnetoresistance element, a magnetic random access memory, a magnetic head and a magnetic storage device.

In one aspect of the present invention, the magnetoresistance element includes an antiferromagnetic layer, a fixed ferromagnetic layer, a first nonmagnetic layer and a free ferromagnetic layer. The antiferromagnetic layer is formed on the upper surface side of a substrate. The fixed ferromagnetic layer is formed on the antiferromagnetic layer. The first nonmagnetic layer is formed on the fixed ferromagnetic layer. The free ferromagnetic layer is formed on the first nonmagnetic layer. The fixed ferromagnetic layer is provided with an amorphous layer. The amorphous layer contains amorphous material having a composition expressed by a chemical formula of X—Y—Z. X represents at least one element selected from Co, Fe and Ni. Y represents at least one element selected from Al, Si, Mg, Ta, Nb, Zr, Hf, W, Mo, Ti and V. Z represents at least one element selected from N, C and B.

Preferably, the fixed ferromagnetic layer further includes a first fixed ferromagnetic layer, a second nonmagnetic layer, and a second fixed ferromagnetic layer. The first fixed ferromagnetic layer is formed on the antiferromagnetic layer and the second nonmagnetic layer is formed on the first fixed ferromagnetic layer. The second fixed ferromagnetic layer is formed on the second nonmagnetic layer.

The amorphous layer is preferably formed between the second nonmagnetic layer and the antiferromagnetic layer. It is preferred that the amorphous layer further contains a compound having a composition expressed by a chemical formula of Y—Z.

In another aspect of the present invention, the manufacturing method of the magnetoresistance element includes a process of forming an antiferromagnetic layer on the upper surface side of a substrate, a process of forming a fixed ferromagnetic layer on the antiferromagnetic layer, a process of forming a first nonmagnetic layer on the fixed ferromagnetic layer, and a process of forming a free ferromagnetic layer on the first nonmagnetic layer. The process of forming the fixed ferromagnetic layer includes a process of forming an amorphous layer. The amorphous layer contains amorphous material having a composition expressed by a chemical formula of X—Y—Z. X represents at least one element selected from Co, Fe and Ni. Y represents at least one element selected from Al, Si, Mg, Ta, Nb, Zr, Hf, W, Mo, Ti and V. Z represents at least one element selected from N, C and B.

Preferably, the process of forming the fixed ferromagnetic layer further includes a process of forming a first fixed ferromagnetic layer on the antiferromagnetic layer, a process of forming a second nonmagnetic layer on the first fixed ferromagnetic layer, and a process of forming a second fixed ferromagnetic layer on the second nonmagnetic layer.

The process of forming the amorphous layer is preferably conducted between the process of forming the second nonmagnetic layer and the process of forming the antiferromagnetic layer.

It is preferred that the amorphous layer further contains a compound having a composition expressed by the chemical formula of Y—Z.

In the above-described manufacturing method of the magnetoresistance element, film deposition for forming the respective layers is conducted in vacuum equipment, in which the ultimate pressure in a film deposition chamber of the vacuum equipment is $3 \times 10^{-6}$ Pa or lower. The present invention reduces impurities taken into a film such as oxygen and hydrogen, and facilitates formation of a compound formed of material having a composition of Y—Z.

In the above-described manufacturing method of the magnetoresistance element, film deposition is carried out by a sputtering method with a sputter gas pressure ranging from 0.01 Pa to 3 Pa. The present invention suppresses abnormal growth and formation of defects in a film, and thereby obtains a TMR film with high heat resistance which is free from diffusion through defects.

In still another aspect of the present invention, the magnetic random access memory includes a plurality of bit lines, a plurality of word lines, and magnetoresistance elements. The plurality of the bit lines are extended in a first direction. The plurality of the word lines are extended in a second direction which is substantially perpendicular to the first direction. The magnetoresistance elements are disposed at positions associated with respective intersections of the plurality of the bit lines and the plurality of the word lines, and described in one of the above explanations.

In order to solve the problems described above, a magnetic head according to the present invention includes a reproducing element, a first magnetic core, a second magnetic core and a coil. The first magnetic core is disposed apart from the reproducing element. The second magnetic core is disposed apart from the first magnetic core so as to form a predetermined gap on an opposite side of the reproducing element with respect to the first magnetic core. The coil is disposed between the first magnetic core and the second magnetic core, separated therefrom by an insulating layer. The reproducing element includes two electrodes provided in a shield and the magnetoresistance which is held between the two electrodes and a magnetoresistance element described in one of the above-described explanations.

In order to solve the problems described above, a magnetic recording device according to the present invention includes a motor, a magnetic head, a holding unit, a moving unit, a recording/reproducing unit and a control unit. The motor rotates a magnetic recording medium. The magnetic head records and reproduces data onto or from the magnetic recording medium, formed as stated above. The holding unit holds the magnetic head. The moving unit moves the holding unit. The recording/reproducing unit drives the magnetic head. The control unit controls a driving unit and the recording/reproducing unit.

In the present invention, the layer mainly consisting of material having a composition of X—Y—Z has an amorphous structure, which suppresses diffusion, mainly of manganese, from the antiferromagnetic layer through grain boundaries. Moreover, element that is easy to diffuse by itself such as N, C and B is formed into a stable compound having a composition of Y—Z, which avoids the diffusion. Further, in the amorphous structure, the compound of Y—Z prevents crystallization of X, which realizes thermal stability in comparison with an amorphous structure simply composed of material having a composition of X—Y. The compound of Y—Z formed in the layer mainly consisting of X—Y—Z has low specific resistance so that no unnecessary resistance increase is observed in the magnetoresistance element. It is an aspect which is largely different from, for example, the fact that the oxide of Y is an insulator.

The present invention improves heat resistance so as not to deteriorate characteristics even after a heat treatment process in an element manufacturing process. This allows increasing the manufacturing yield and reducing the manufacturing cost.

BRIEF DESCRIPTION OF DRAWINGS

FIG. 23 is a chart showing examples of the structure in FIG. 9 according to the embodiment of the present invention;

FIG. 24 is a chart showing examples of the structure in FIG. 9 according to the embodiment of the present invention;

FIG. 25 is a chart showing examples of the structures in FIGS. 10 to 13 according to the embodiment of the present invention; and FIG. 26 is a chart showing examples of the structures in FIGS. 14 to 17 according to the embodiment of the present invention.

BEST MODE FOR CARRYING OUT THE INVENTION

Preferred embodiments of a magnetoresistance element, a manufacturing method of the magnetoresistance element, a magnetic random access memory, the magnetic head and the magnetic storage device according to the present invention will be explained below with reference the attached drawings.

Figure 1:
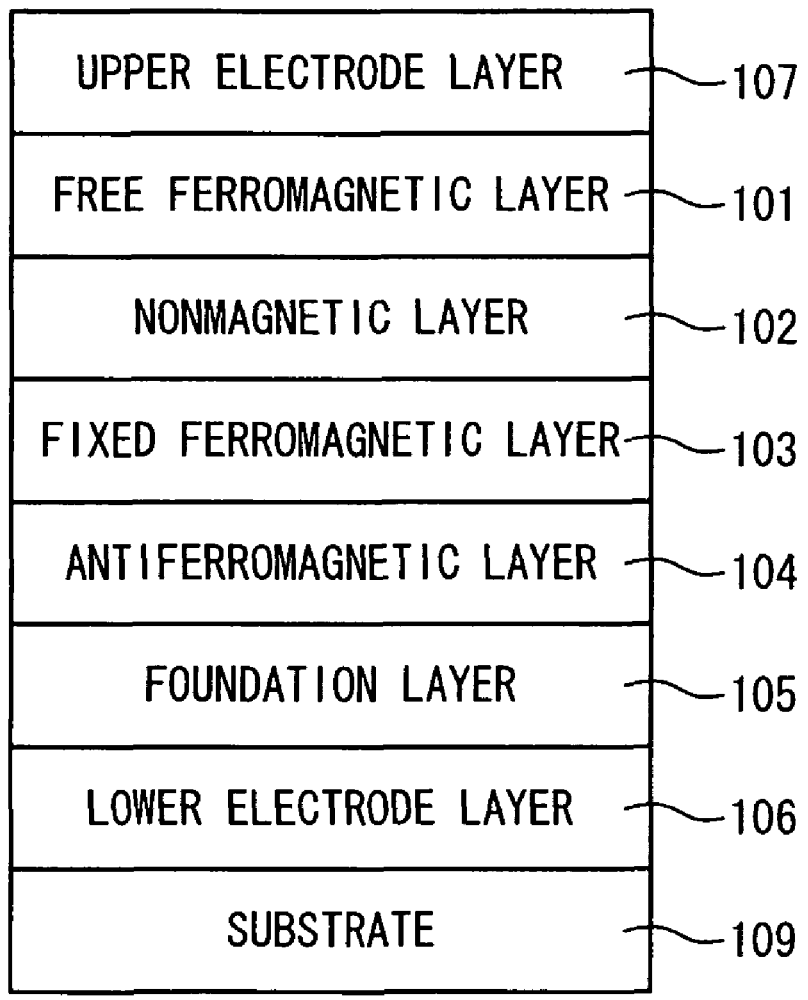
FIG. 1 is a cross sectional view showing an example of the structure of a spin valve type TMR film stack using the exchange coupling as a magnetoresistance element.
Figure 2:
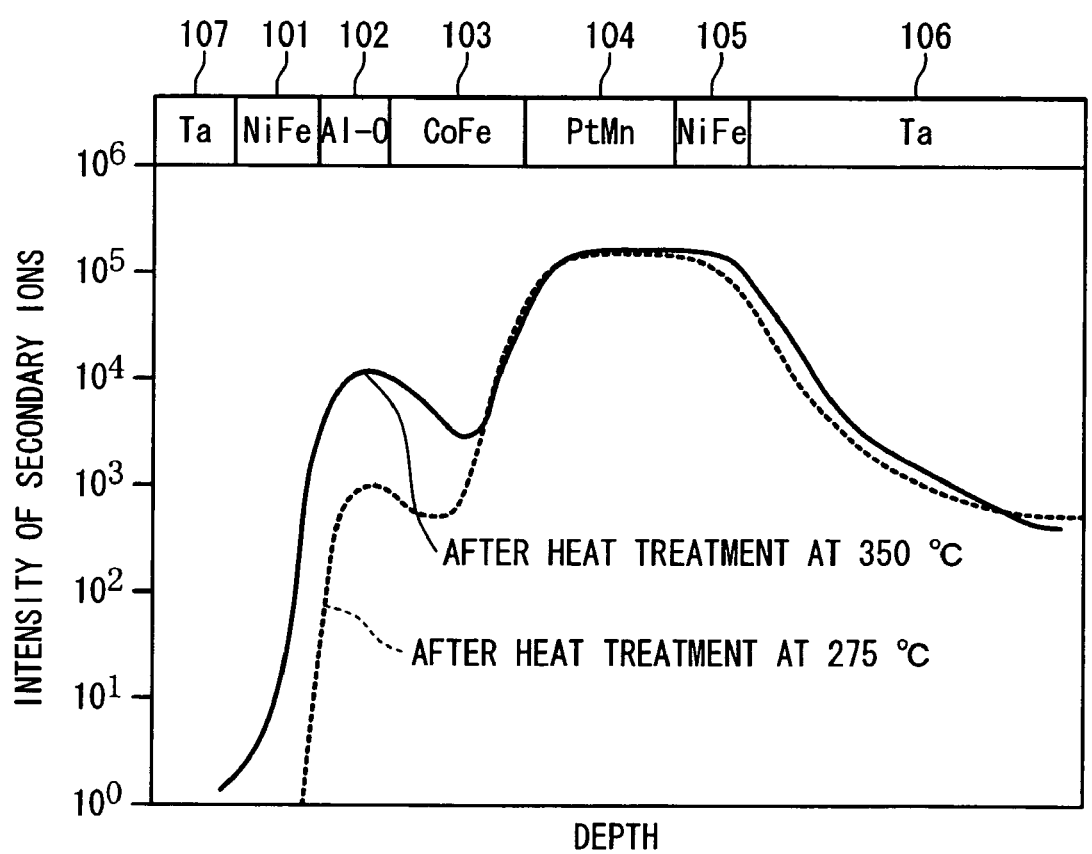
FIG. 2 is a graph showing distribution of manganese in TMR film stacks subjected to heat treatment at 275° C. and 350° C.
Figure 3:
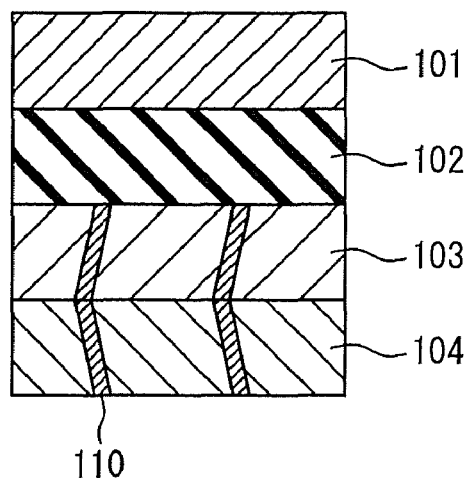
FIG. 3 is a cross sectional view showing the structure of the TMR film stack in a conventional technique.
Figure 4:
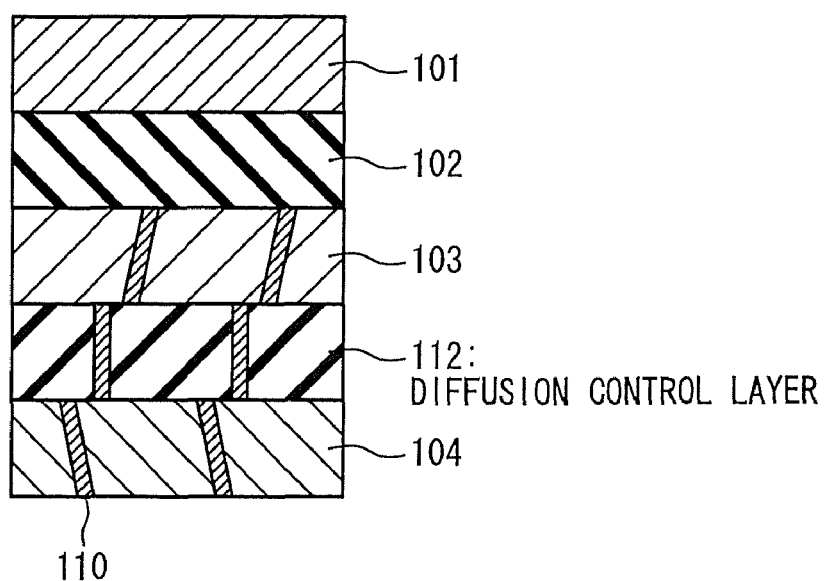
FIG. 4 is a cross sectional diagram showing the structure of the TMR film in the conventional technique.
Figure 5:
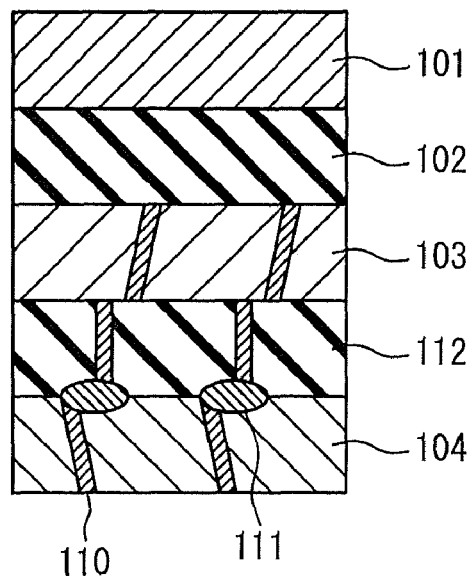
FIG. 5 is a cross sectional view of the TMR film stack showing diffusion of manganese in the conventional technique.
Figure 6:
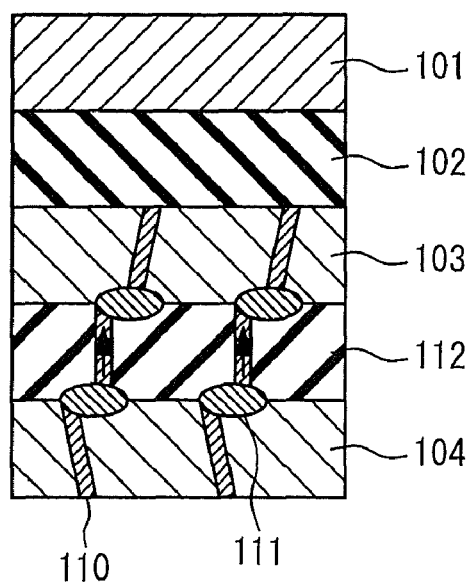
FIG. 6 is a cross sectional view of the TMR film stack showing diffusion of manganese in the conventional technique.
Figure 7:
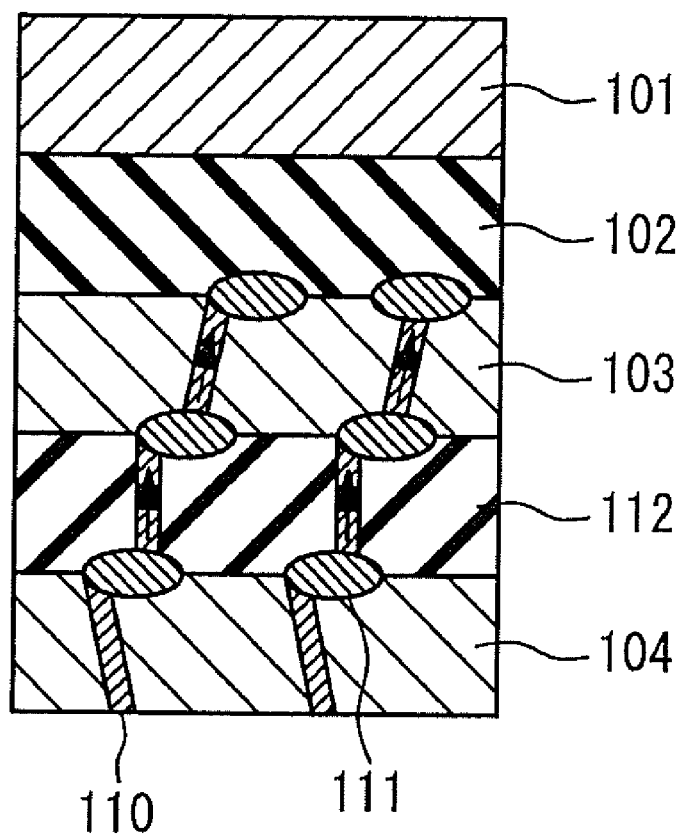
FIG. 7 is a cross sectional view of the TMR film stack showing diffusion of manganese in the conventional technique.
Figure 8:
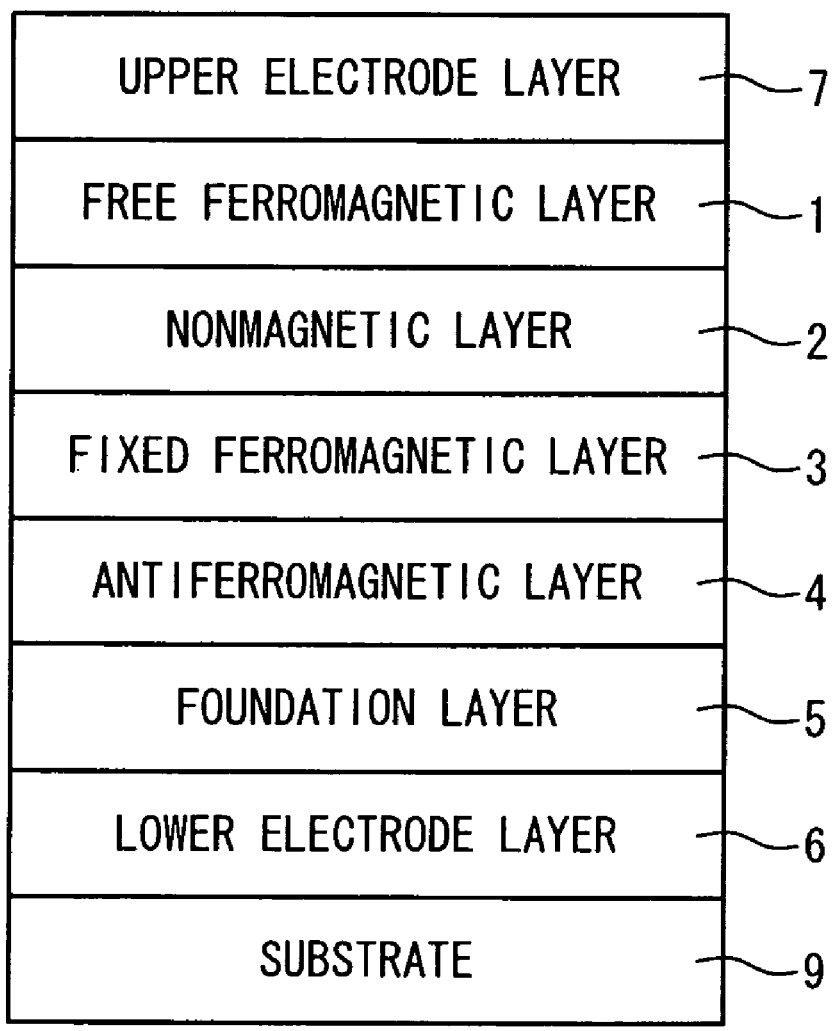
FIG. 8 is a cross sectional view showing the structure of a magnetoresistance element according to an embodiment of the present invention.

Embodiments of a magnetoresistance element according to the present invention will be explained with reference to the attached drawings. First, the structure of the magnetoresistance element according to embodiments of the present invention will be explained. FIG. 8 is a cross sectional view showing the structure of the magnetoresistance element according to an embodiment of the present invention. The magnetoresistance element includes a foundation layer 5, an antiferromagnetic layer 4, a fixed ferromagnetic layer 3, a nonmagnetic layer 2 and a free ferromagnetic layer 1. The magnetoresistance element is connected to a lower electrode layer 6 and an upper electrode layer 7. The order of the layer lamination may be reversed.

The lower electrode layer 6 is formed on the upper surface side of a substrate. A suitable material thereof includes at least one metal selected from, for example, Ta, Ti, V, Nb, Mo, Zr, Hf, Cr, Al, Pt, Ir, Au, Ru, Rh, Pd, Ag and Cu, or TaN and TiN. This provides a reduced resistance for the lower electrode layer 6. The foundation layer 5 is formed on the lower electrode layer 6. A suitable material thereof includes, for example, NiFe, NiCr, NiFeCr, Ru and Cu. This allows controlling crystallinity of the antiferromagnetic layer 4 formed on the foundation layer 5.

The antiferromagnetic layer 4 is formed on the foundation layer 5. A suitable material thereof includes antiferromagnetic material such as, for example, Mn-A, where A represents at least one metal selected from Pt, Ir, Pd, Rh, Fe, Co and Ni. The antiferromagnetic layer 4 allows the magnetization direction of the fixed ferromagnetic layer 3 formed thereon to be fixed. The fixed ferromagnetic layer 3 is a magnetization fixed layer formed on the antiferromagnetic layer 4. Details of the fixed ferromagnetic layer 3 will be explained below.

The nonmagnetic layer 2 is formed on the fixed ferromagnetic layer 3. When the nonmagnetic layer 2 is composed of a tunnel barrier layer using insulating material, there is no particular limitation for the material thereof as long as nonmagnetic insulating material or semiconductor is used. For example, preferably used is a compound formed of at least one element selected from Mg, Ti, Zr, Hf, V, Nb, Ta, Cr, Zn, Al, Ga, Si, the IIa to VIa group and the IIb to IVb group, and at least one element selected from F, O, C, N and B. Particularly oxide, nitride and oxynitride of aluminum are more preferable due to excellent insulating characteristics, capability of thin film formation, and excellence in stability and reproduction. When conductive material is used for the nonmagnetic layer 2, preferably used is at least one nonmagnetic element selected from Cu, Au, Ag, Ru and Cr. The use of a film of simple substance of any of the above-described elements and the use of an alloy film containing the above elements are both acceptable. The use of the nonmagnetic layer described above provides relatively low junction resistance for the magnetoresistance element.

The free ferromagnetic layer 1 is a magnetization free layer formed on the nonmagnetic layer 2. Suitable material thereof includes at least one metal selected from, for example, Fe, Co and Ni as a main component. These metals or alloys have a high spin polarizability, and therefore provides a large MR ratio for the magnetoresistance element. These metals or alloys may also contain at least one element selected from Ti, V, Cr, Zr, Nb, Mo, Hf, Ta, W, Al, Si, Ir, Pt, B, C, N and O. Doping of these elements improves magnetization characteristics.

The upper electrode layer 7 is formed on the free ferromagnetic layer 1. A suitable material thereof includes at least one metal selected from, for example, Ta, Ti, V, Nb, Mo, Zr, Hf, Cr, Al, Pt, Ir, Au, Ru, Rh, Pd, Ag, Cu, tantalum nitride and titanium nitride. These material provide a small resistance for the upper electrode layer.

Figure 9:
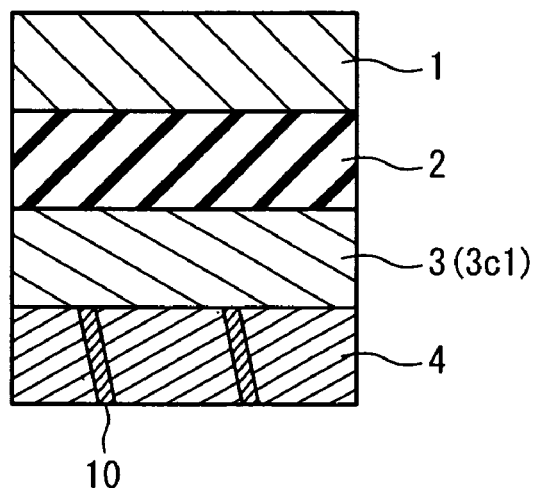
FIG. 9 is a cross sectional view showing a detailed structure of the magnetoresistance element according to the embodiment of the present invention.

FIG. 9 is a cross-sectional view showing the detailed structure of the magnetoresistance element according to the embodiment of the present invention. FIG. 9 shows an example in which the fixed ferromagnetic layer 3 is used as a diffusion suppressing layer 3c1 in the structure consisting of the antiferromagnetic layer 4, the fixed ferromagnetic layer 3, the nonmagnetic layer 2 and the free ferromagnetic layer 1 shown in FIG. 8. The diffusion suppressing layer 3c1 has a function of suppressing diffusion of manganese of the antiferromagnetic layer 4 in addition to a function as a magnetization fixed layer. The diffusion suppressing layer 3c1 is an amorphous layer mainly consisting of material having a composition of X—Y—Z, including a compound having a composition of Y—Z. Here, X represents at least one element selected from Co, Fe and Ni. Y represents at least one element selected from Al, Si, Mg, Ta, Nb, Zr, Hf, W, Mo, Ti and V. Z represents at least one element selected from N, C and B.

When formed by a physical vapor deposition method such as a sputtering method, the material of X—Y—Z is separated into X and a Y—Z compound, since Z is bonded to Y more easily than X. Then, the material of X—Y—Z is formed to be amorphous as a whole without depositing a crystal layer, so that crystal grain boundaries are not formed. Therefore, manganese, that has a tendency of diffusing from the antiferromagnetic layer 4 through the crystal gain boundaries 10, is prevented from diffusing by the diffusion suppressing layer 3c1, which is amorphous material without crystal gain boundaries. The material Z, which easily travels across the film, is stabilized due to the bonding with material Y. Since the diffusion suppressing layer needs to be magnetic material, the diffusion suppressing layer includes the material X as a magnetic material. This provides a function as a magnetic substance and a function as a diffusion suppressing layer.

Assuming that materials X, Y and Z have an element ratio (%) of a (%):b (%):c (%), it is preferable that $40 \leq a < 100$, $0 < b \leq 30$, and $0 < c \leq 30$ for achieving the suppression effect of the manganese diffusion and for forming ferromagnetic material. It is especially preferable that $60 \leq a < 100$, $0 < b \leq 20$, and $0 < c \leq 20$ for obtaining a large saturation magnetization of 5 kG or more. It is preferable that $40 \leq a < 90$, $5 < b \leq 30$, and $5 < c \leq 30$ for stabilizing the amorphous structure and obtain a remarkable suppression effect of the manganese diffusion. In other words, it is more preferable that $60 \leq a < 90$, $5 < b \leq 20$, and $5 < c \leq 20$ for achieving high saturation magnetization and the remarkable suppression effect of the manganese diffusion.

Described below are conditions of sputtering for film deposition of the magnetoresistance element in order to obtain the remarkable suppression effect of the manganese diffusion. The ultimate pressure in a film forming chamber is $3 \times 10^{-6}$ Pa or less. More preferably, the ultimate pressure is $1 \times 10^{-6}$ Pa or less. This reduces impurities taken into the film such as oxygen or hydrogen, so as to enhance the formation of the compound of Y—Z as a main component and homogeneous deposition of the amorphous phase.

Moreover, the sputtering gas pressure in the film formation is preferably 3 Pa or lower. More preferably, the sputtering gas pressure is 1 Pa or lower. This suppresses abnormal growth and formation of defects in the film so as to obtain a magnetoresistance element with high heat resistance which is free from diffusion through defects. The sputtering gas pressure is preferably 0.01 Pa or higher. This is because the gas pressure of less than 0.01 Pa destabilizes electric discharges in the sputtering.

Figure 10:
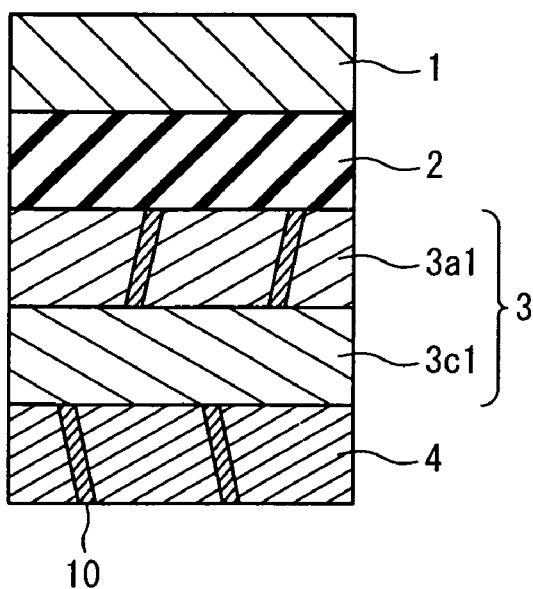
FIG. 10 is a cross sectional view showing another detailed structure of the magnetoresistance element according to the embodiment of the present invention.

FIG. 10 is a cross sectional view showing another detailed structure of the magnetoresistance element according to the embodiment of the present invention. FIG. 10 shows an example in which the fixed ferromagnetic layer 3 is composed of a stack structure of a diffusion suppressing layer 3c1 and a ferromagnetic layer 3a1, within the structure of the antiferromagnetic layer 4, the fixed ferromagnetic layer 3, the nonmagnetic layer 2 and the free ferromagnetic layer 1 shown in FIG. 8. The diffusion suppressing layer 3c1 is formed on the antiferromagnetic layer 4. The diffusion suppressing layer 3c1 is structured identically to that explained in FIG. 9.

The ferromagnetic layer 3a1 is formed on the diffusion suppressing layer 3c1. At least one metal selected from, for example, Fe, Co and Ni is suitably used as the main component of the ferromagnetic layer 3a1. These metals or alloys exhibit a high spin polarizability, and allow obtaining a magnetoresistance element with a large MR ratio. The metal or alloy of the ferromagnetic layer 3a1 may also contain at least one element selected from Ti, V, Cr, Zr, Nb, Mo, Hf, Ta, W, Al, Si, Ir, Pt, B, C, N and O. Doping these elements improves magnetization characteristics.

Figure 11:
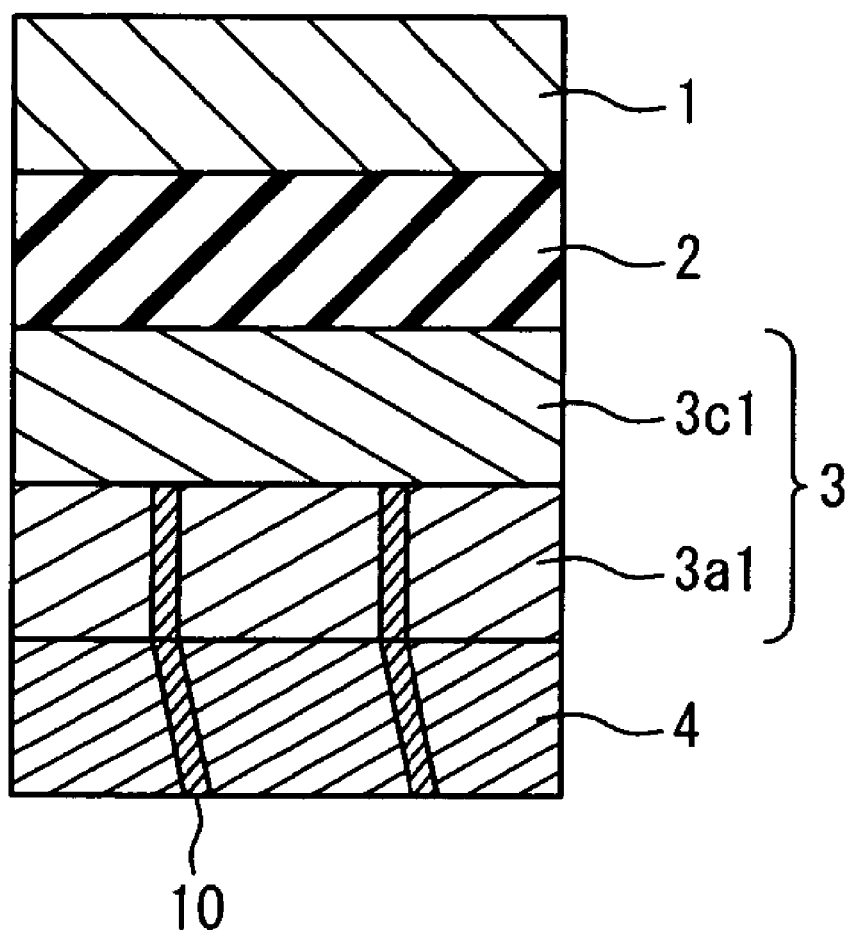
FIG. 11 is a cross sectional view showing still another detailed structure of the magnetoresistance element according to the embodiment of the present invention.

FIG. 11 is a cross sectional view illustrating still another detailed structure of the magnetoresistance element according to the embodiment of the present invention. FIG. 11 shows an example in which the fixed ferromagnetic layer 3 is composed of a stack structure of a ferromagnetic layer 3a1 and a diffusion suppressing layer 3c1, within the structure of the antiferromagnetic layer 4, the fixed ferromagnetic layer 3, the nonmagnetic layer 2 and the free ferromagnetic layer 1 shown in FIG. 8. The ferromagnetic layer 3a1 is formed on the antiferromagnetic layer 4. The ferromagnetic layer 3a1 is structured identically to that explained in FIG. 10. The diffusion suppressing layer 3c1 is formed on the ferromagnetic layer 3a1. The diffusion suppressing layer 3c1 is structured identically to that explained in FIG. 9.

Figure 12:
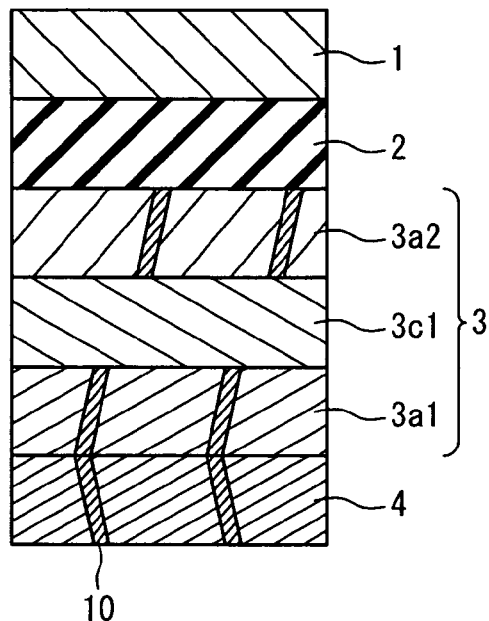
FIG. 12 is a cross sectional view showing still another detailed structure of the magnetoresistance element according to the embodiment of the present invention.

FIG. 12 is a cross sectional view showing still another detailed structure of the magnetoresistance element according to the embodiment of the present invention. FIG. 12 shows an example in which the fixed ferromagnetic layer 3 is composed of a stack structure of a ferromagnetic layer 3a1, a diffusion suppressing layer 3c1, and a ferromagnetic layer 3a2, within the structure of the antiferromagnetic layer 4, the fixed ferromagnetic layer 3, the nonmagnetic layer 2 and the free ferromagnetic layer 1 shown in FIG. 8. The ferromagnetic layer 3a1 is formed on the antiferromagnetic layer 4. The ferromagnetic layer 3a1 is structured identically to that explained in FIG. 10. The diffusion suppressing layer 3c1 is formed on the ferromagnetic layer 3a1. The diffusion suppressing layer 3c1 is structured identically to that explained in FIG. 9. The ferromagnetic layer 3a2 is formed on the diffusion suppressing layer 3c1. The ferromagnetic layer 3a2 is structured identically to that explained in FIG. 10.

Figure 13:
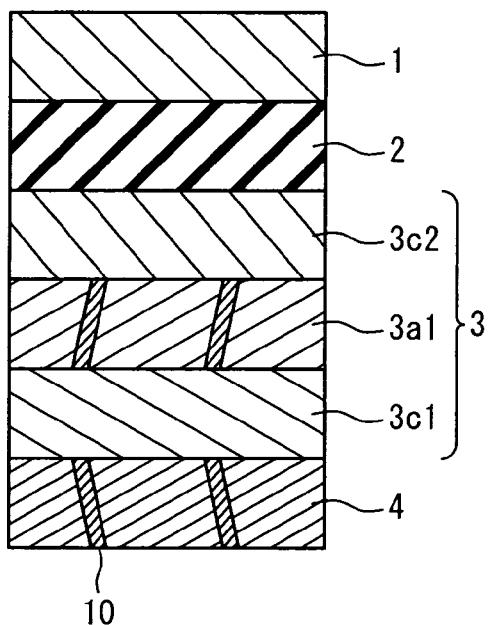
FIG. 13 is a cross sectional view showing still another detailed structure of the magnetoresistance element according to the embodiment of the present invention.

FIG. 13 is a cross sectional view showing still another detailed structure of the magnetoresistance element according to the embodiment of the present invention. FIG. 13 shows an example in which the fixed ferromagnetic layer 3 is composed of a stack structure of a diffusion suppressing layer 3c1, a ferromagnetic layer 3a1, and a diffusion suppressing layer 3c2, within the structure of the antiferromagnetic layer 4, the fixed ferromagnetic layer 3, the nonmagnetic layer 2 and the free ferromagnetic layer 1 shown in FIG. 8. The diffusion suppressing layer 3c1 is formed on the antiferromagnetic layer 4. The diffusion suppressing layer 3c1 is structured identically to that explained in FIG. 9. The ferromagnetic layer 3a1 is formed on the diffusion suppressing layer 3c1. The ferromagnetic layer 3a1 is structured identically to that explained in FIG. 10. The diffusion suppressing layer 3c2 is formed on the ferromagnetic layer 3a1. The diffusion suppressing layer 3c2 is structured identically to that explained in FIG. 9.

Figure 14:
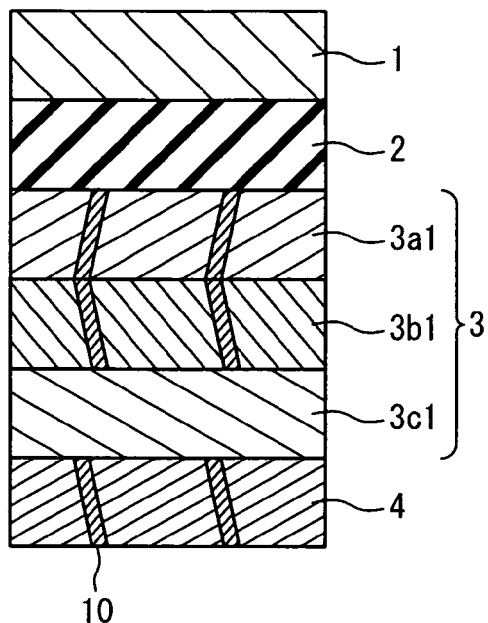
FIG. 14 is a cross sectional view showing still another detailed structure of the magnetoresistance element according to the embodiment of the present invention.

FIG. 14 is a cross sectional view showing still another detailed structure of the magnetoresistance element according to the embodiment of the present invention. FIG. 14 shows an example in which the fixed ferromagnetic layer 3 is composed of a stack structure of a diffusion suppressing layer 3c1, a magnetization coupling layer 3b1, and a ferromagnetic layer 3a1, within the structure of the antiferromagnetic layer 4, the fixed ferromagnetic layer 3, the nonmagnetic layer 2 and the free ferromagnetic layer 1 shown in FIG. 8. The diffusion suppressing layer 3c1 is formed on the antiferromagnetic layer 4. The diffusion suppressing layer 3c1 is structured identically to that explained in FIG. 9. The magnetization coupling layer 3b1 is formed on the diffusion suppressing layer 3c1. The magnetization coupling layer 3b1 is designed so that the magnetization directions of upper and lower magnetic layers thereof are fixed in the opposite directions from each other. This allows the magnetic flux leaking from end portions of the upper and lower magnetic layers to form a closed magnetic circuit, and thereby prevents the magnetic flux from leaking externally. It is preferable that the magnetization coupling layer 3b1 is an antiferromagnetic film containing at least one element selected from, for example, Cr, Cu, Ag, Au, Ru, Ir, Re and Os. The magnetization coupling layer 3b1 may be a single film or a film stack consisting of an alloy or oxide containing the above elements. The film thickness of the magnetic coupling layer 3b1 preferably ranges from 0.3 to 1.3 nm. The ferromagnetic layer 3a1 is formed on the magnetic coupling layer 3b1. The ferromagnetic layer 3a1 is structured identically to that explained in FIG. 10.

Figure 15:
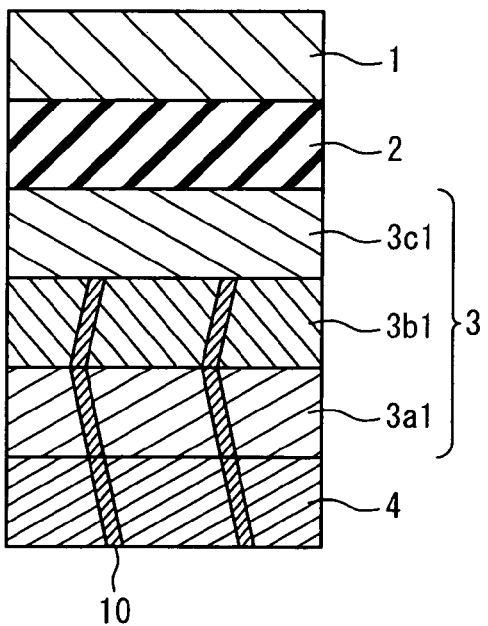
FIG. 15 is a cross sectional view showing still another detailed structure of the magnetoresistance element according to the embodiment of the present invention.

FIG. 15 is a cross sectional view showing still another detailed structure of the magnetoresistance element according to the embodiment of the present invention. FIG. 15 shows an example in which the fixed ferromagnetic layer 3 is composed of a stack structure of a ferromagnetic layer 3a1, a magnetization coupling layer 3b1, and a diffusion suppressing layer 3c1, within the structure of the antiferromagnetic layer 4, the fixed ferromagnetic layer 3, the nonmagnetic layer 2 and the free ferromagnetic layer 1 shown in FIG. 8. The ferromagnetic layer 3a1 is formed on the antiferromagnetic layer 4. The ferromagnetic layer 3a1 is structured identically to that explained in FIG. 10. The magnetization coupling layer 3b1 is formed on the ferromagnetic layer 3a1. The magnetization coupling layer 3b1 is structured identically to that explained in FIG. 14. The diffusion suppressing layer 3c1 is formed on the magnetic coupling layer 3b1. The diffusion suppressing layer 3c1 is structured identically to that explained in FIG. 9.

Figure 16:
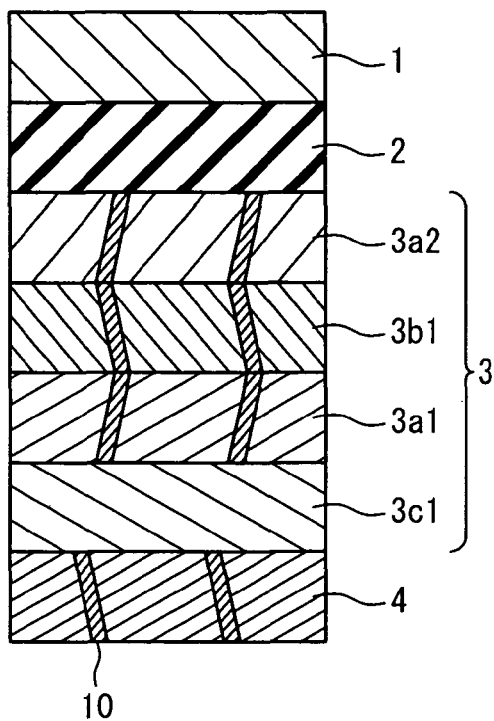
FIG. 16 is a cross sectional diagram showing still another detailed structure of the magnetoresistance element according to the embodiment of the present invention.

FIG. 16 is a cross sectional view showing still another detailed structure of the magnetoresistance element according to the embodiment of the present invention. FIG. 16 shows an example in which the fixed ferromagnetic layer 3 is composed of a stack structure of a diffusion suppressing layer 3c1, a ferromagnetic layer 3a1, a magnetization coupling layer 3b1 and a ferromagnetic layer 3a2, within the structure of the antiferromagnetic layer 4, the fixed ferromagnetic layer 3, the nonmagnetic layer 2 and the free ferromagnetic layer 1 shown in FIG. 8. The diffusion suppressing layer 3c1 is formed on the antiferromagnetic layer 4. The diffusion suppressing layer 3c1 is structured identically to that explained in FIG. 9. The ferromagnetic layer 3a1 is formed on the diffusion suppressing layer 3c1. The ferromagnetic layer 3a1 is structured identically to that explained in FIG. 10. The magnetization coupling layer 3b1 is formed on the ferromagnetic layer 3a1. The magnetization coupling layer 3b1 is structured identically to that explained in FIG. 14. The ferromagnetic layer 3a2 is formed on the magnetization coupling layer 3b1. The ferromagnetic layer 3a2 is structured identically to that explained in FIG. 10.

Figure 17:
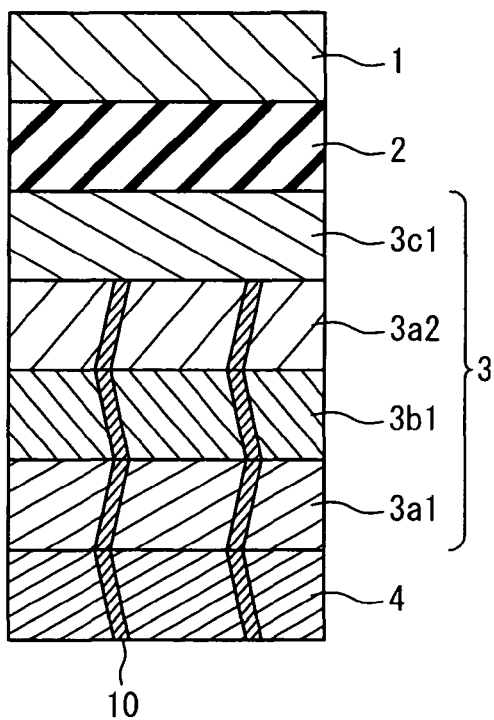
FIG. 17 is a cross sectional view showing still another detailed structure of the magnetoresistance element according to the embodiment of the present invention.

FIG. 17 is a cross sectional view showing still another detailed structure of the magnetoresistance element according to the embodiment of the present invention. FIG. 17 shows an example in which the fixed ferromagnetic layer 3 is composed of a stack structure of a ferromagnetic layer 3a1, a magnetization coupling layer 3b1, a ferromagnetic layer 3a2 and a diffusion suppressing layer 3c1 within the structure of the antiferromagnetic layer 4, the fixed ferromagnetic layer 3, the nonmagnetic layer 2 and the free ferromagnetic layer 1 shown in FIG. 8. The ferromagnetic layer 3a1 is formed on the antiferromagnetic layer 4. The ferromagnetic layer 3a1 is structured identically to that explained in FIG. 10. The magnetization coupling layer 3b1 is formed on the ferromagnetic layer 3a1. The magnetization coupling layer 3b1 is structured identically to that explained in FIG. 14. The ferromagnetic layer 3a2 is formed on the magnetization coupling layer 3b1. The ferromagnetic layer 3a2 is structured identically to that explained in FIG. 10. The diffusion suppressing layer 3c1 is formed on the ferromagnetic layer 3a2. The diffusion suppressing layer 3c1 is structured identically to that explained in FIG. 9.

In the manufacturing method of the magnetoresistance element according to the present invention, the ultimate pressure in the film forming chamber is preferably $3 \times 10^{-6}$ Pa or less before film formation. More preferably, the ultimate pressure is $1 \times 10^{-6}$ Pa or less. This reduces impurities taken into the films, such as oxygen or hydrogen, and enhances the formation of the compound mainly consisting of Y—Z and the deposition of the amorphous material. Additionally, an unnecessary increase of the resistance due to the impurity contamination is also suppressed.

Moreover, in the manufacturing method of the magnetoresistance element according to the present invention, the sputtering gas pressure is preferably 3 Pa or lower during the film formation. More preferably, the sputtering gas pressure is 1 Pa or lower. This suppresses abnormal growth and formation of defects in the films so as to obtain a magnetoresistance element with high heat resistance, which is free from diffusion through defects. Additionally, the sputtering gas pressure is preferably 0.01 Pa or higher. This is because the gas pressure of less than 0.01 Pa destabilizes the electric discharge during sputtering.

The magnetoresistance element of the present invention, which has the diffusion suppressing layer 3c1, prevents the manganese diffusion to the amorphous layer 2 caused by heat treatment in the element manufacturing process, due to the function of the diffusion suppressing layer 3c1 suppressing the manganese diffusion. Therefore, the deterioration of characteristics, such as the magnetoresistance effect, is prevented in the magnetoresistance element even after heat treatment at 350° C. or higher. Additionally, the manufacturing yield is improved to obtain a magnetoresistance film stack with low manufacturing cost.

The magnetoresistance element according to the present invention may be applied to an MRAM as memory elements (or memory cells). A plurality of memory elements are arranged in a matrix form at respective intersections of a plurality of bit (sense) lines and a plurality of word lines, which are composed of Cu, Al or the like. By using a synthetic magnetic field generated by signal currents flowing through a selected bit line selected from the plurality of the bit lines and a selected word lines selected from the plurality of the word lines, respectively, a signal is recorded into a memory cell at the intersection of the selected bit line and the selected word line. Application of the magnetoresistance element according to the present invention to an MRAM realizes an MRAM with high heat resistance, high manufacturing yield and low manufacturing cost.

The magnetoresistance element according to the present invention may be applied to a magnetic head as a reproducing element. A typical example of such magnetic head is a shield-type magnetic head provided with a shield restricting introduction of a magnetic field other than a magnetic field to be detected by a reproducing element into the reproducing element. The magnetic head includes a write head unit for recording and a reproduction head unit for reproducing. In data recording, a magnetic flux generated by a current flowing through a coil of a recording head leaks from a recording gap, which is a spacing between an upper recording core and a lower magnetic core, to achieve recording into a magnetic recording medium. Data reproduction is achieved on the basis of the change in the resistance of the reproducing element caused by the application of a magnetic flux corresponding to the data recorded on the magnetic recording medium to the reproducing element through a reproduction gap, which is a spacing between an upper shield and a lower shield. Since a magnetic field except for the magnetic field to be detected by the reproducing element is restricted by the shield, a magnetic head with high sensitivity can be realized. A high-output magnetic head with excellent heat resistance can be also achieved by incorporating the reproducing element according to the present invention.

Application of the magnetic head using the magnetoresistance element according to the present invention allows providing a magnetic recording device such as an HDD. Such magnetic recording device includes a magnetic head, a driving unit, a magnetic recording medium for recording information, and a signal processing unit, in which the magnetic head of the present invention is used to realize a stable magnetic recording device having heat resistance.

FIRST EMBODIMENT

FIG. 23 is a chart showing embodiments of the present invention with the structure of FIG. 9. The lower electrode layer 6, the foundation layer 5, the antiferromagnetic layer 4, the fixed ferromagnetic layer 3, the nonmagnetic layer 2, the free ferromagnetic layer 1 and the upper electrode layer 7 are composed of materials described in the chart, respectively. Numbers described in the parentheses indicate film thicknesses (nm). The respective films are formed by a sputtering method. The ultimate pressure is $7 \times 10^{-7}$ Pa, and the sputtering gas pressure (Ar) is 0.3 Pa. The sputtering electric power is set to 300 W. It should be noted that an Al—O film as the nonmagnetic layer 2 is subjected to oxidization with plasma generated by feeding high frequency electric power of 300 W to Ar gas atmosphere containing oxygen after film formation of metal aluminum. The sputtering gas and the gas used for the oxidization are not limited to Ar; Kr or Xe may be used instead. Thereafter, the magnetoresistance element formed by the sputtering method is subjected to heat treatment at 250° C. for 5 hours in vacuum with a magnetic field of 1.3 T applied unidirectionally. The heat treatment is not limited to be conducted in vacuum; the heat treatment may be conducted in a nitrogen atmosphere or in an inert gas such as Ar, Kr and Xe.

As shown in FIG. 23, small MR ratios of about 10% are obtained after heat treatment at 350° C. for 30 minutes conducted thereafter with respect to comparative examples, while large MR ratios of about 40% or larger are obtained with respect to structures of FIG. 9 according to the present invention. These values are large enough to provide high performance for an MRAM and a magnetic head when the magnetoresistance element is applied to the MRAM and the magnetic head. Repeatability of these results is excellent.

SECOND EMBODIMENT

FIG. 24 is a chart showing embodiments of the present invention with the structure of FIG. 9. The lower electrode layer 6, the foundation layer 5, the antiferromagnetic layer 4, the fixed ferromagnetic layer 3, the nonmagnetic layer 2, the free ferromagnetic layer 1 and the upper electrode layer 7 are composed of materials described in the chart, respectively. Numbers described in parentheses indicate film thicknesses (nm). The respective films are formed by a sputtering method. The ultimate pressures (Pa) and the sputtering gas (Ar) pressures (Pa) are described in the chart, respectively. Other conditions are as explained in FIG. 23.

As shown in FIG. 24, the small MR ratios of about 10% are obtained after heat treatment at 350° C. for 30 minutes conducted thereafter with respect to the comparative examples, while large MR ratios of about 40% or larger are obtained with respect to the structure (FIG. 9) according to the present invention. These values are large enough to provide high performance for an MRAM and a magnetic head, when the magnetoresistance element is applied to the MRAM and the magnetic head. Repeatability of these results is excellent.

THIRD EMBODIMENT

FIG. 25 is a chart showing embodiments of the present invention with the structures of FIGS. 10 to 13. The lower electrode layer 6, the foundation layer 5, the antiferromagnetic layer 4, the fixed ferromagnetic layer 3, the nonmagnetic layer 2, the free ferromagnetic layer 1 and the upper electrode layer 7 are composed of materials described in the chart, respectively. Numbers described in the parentheses indicate film thicknesses (nm). The respective films are formed by a sputtering method. The ultimate pressure is $7 \times 10^{-7}$ Pa, and the sputtering gas pressure (Ar) is 0.3 Pa. The sputtering electric power is set to 300 W. Other conditions are as explained in FIG. 23.

As shown in FIG. 25, small MR ratios of about 10% are obtained after heat treatment at 350° C. for 30 minutes conducted thereafter with respect to the comparative examples, while large MR ratios of about 40% or larger are obtained with respect to the structures (FIGS. 10 to 13) according to the present invention. These values are large enough to provide high performance for an MRAM and a magnetic head, when the magnetoresistance element is applied to the MRAM and the magnetic head. Repeatability of these results is excellent.

FOURTH EMBODIMENT

FIG. 26 is a chart showing embodiments of the present invention with the structures shown in FIGS. 14 to 17. The lower electrode layer 6, the foundation layer 5, the antiferromagnetic layer 4, the fixed ferromagnetic layer 3, the nonmagnetic layer 2, the free ferromagnetic layer 1 and the upper electrode layer 7 are composed of materials described in the chart, respectively. Numbers described in the parentheses indicate film thicknesses (nm). The respective films are formed by a sputtering method. The ultimate pressure is $7 \times 10^{-7}$ Pa, and the sputtering gas pressure (Ar) is 0.3 Pa. The sputtering electric power is set to 300 W. Other conditions are as explained in FIG. 23.

As shown in FIG. 26, small MR ratios of about 10% are obtained after heat treatment at 350° C. for 30 minutes conducted thereafter with respect to comparative examples, while large MR ratios of about 40% or larger are obtained with respect to the structures (FIGS. 14 to 17) according to the present invention. These values are large enough to provide high performance for an MRAM and a magnetic head, when the magnetoresistance element is applied to the MRAM and the magnetic head. Repeatability of these results is also excellent.

FIFTH EMBODIMENT

Figure 18:
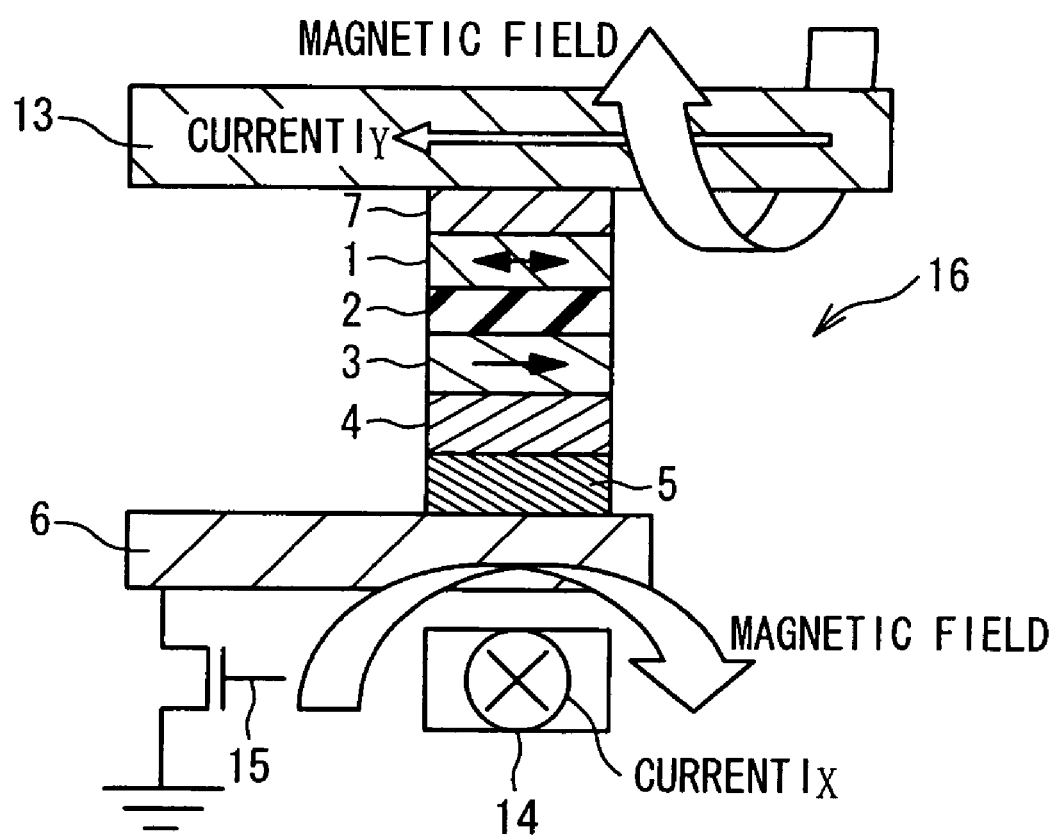
FIG. 18 is a cross sectional view showing the structure of the magnetoresistance element applied to an MRAM as a memory cell.
Figure 19:
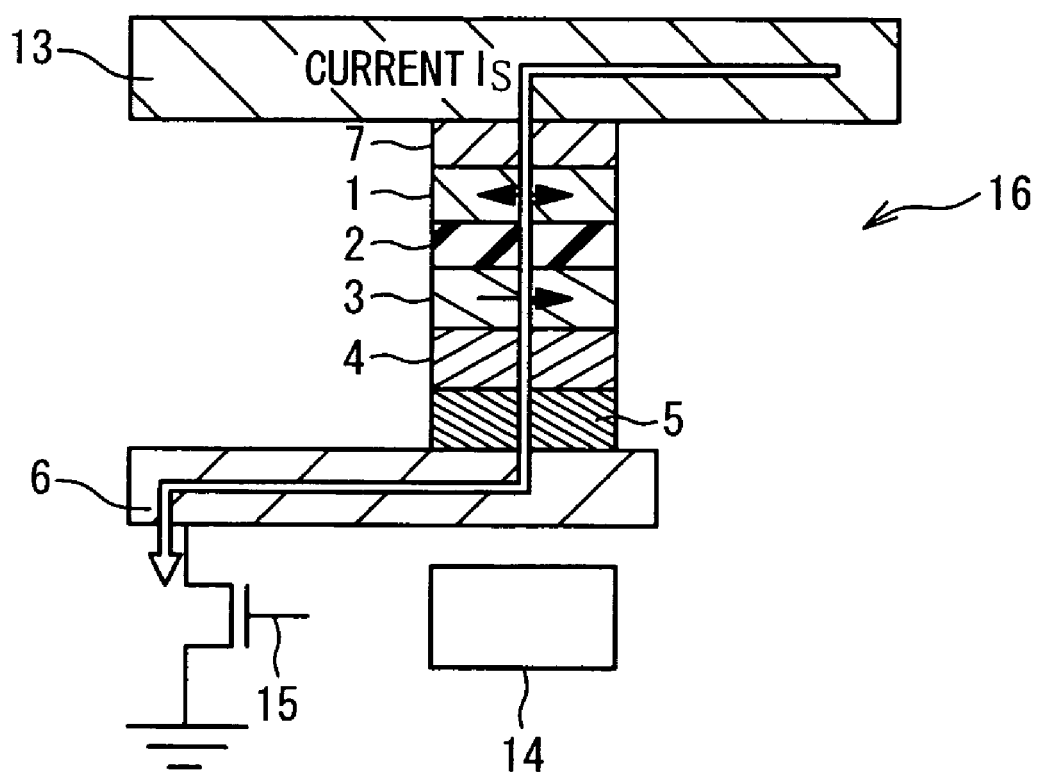
FIG. 19 is a cross sectional view showing the structure of the magnetoresistance element applied to the MRAM as the memory cell.
Figure 20:
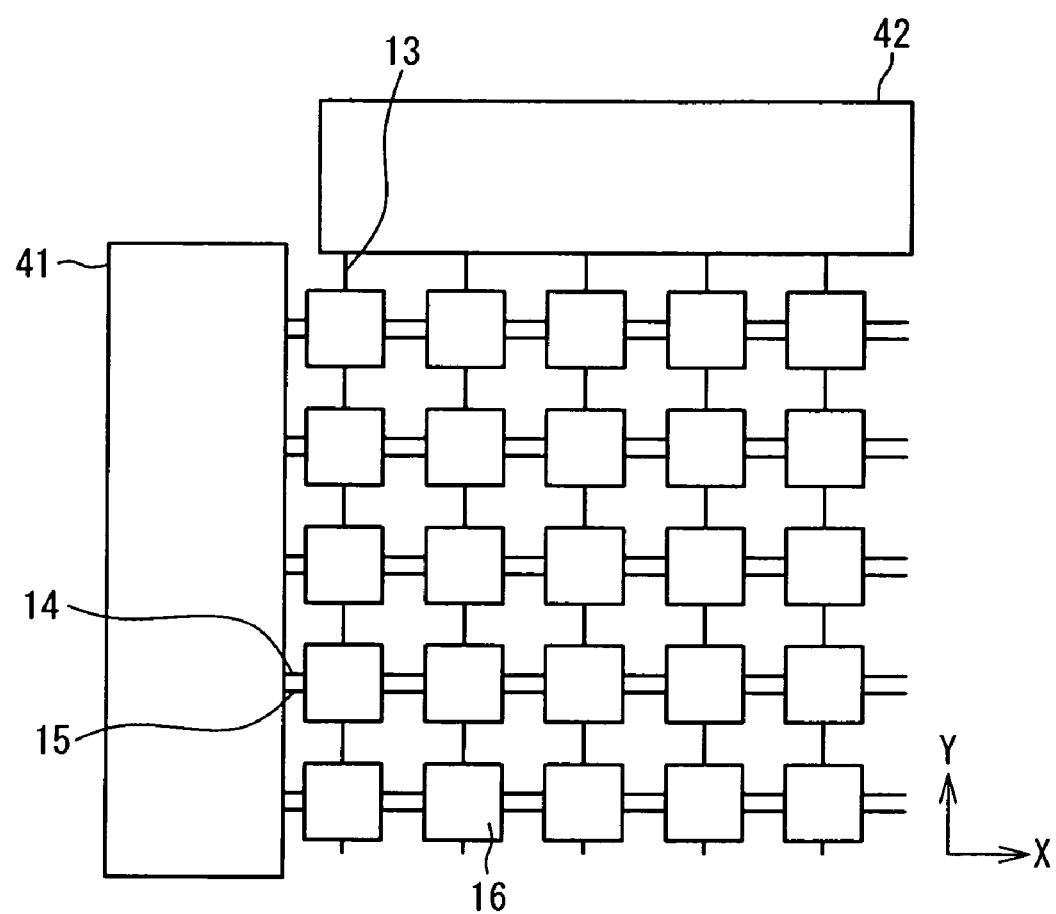
FIG. 20 is a block diagram showing the MRAM in which magnetoresistance elements are arranged in a matrix form.

An MRAM is prepared using magnetoresistance elements according to the present invention as memory elements. FIGS. 18 and 19 are cross sectional views showing the structure of the magnetoresistance elements applied to the MRAM as memory elements. FIG. 20 is a block diagram showing the MRAM in which the magnetoresistance elements are arranged in a matrix form.

As shown in FIG. 20, the MRAM includes a plurality of bit lines 13, a plurality of write word lines 14, a plurality of read word lines 15, a Y selector 41, an X selector 42, and a plurality of memory elements 16. The bit lines 13 are extended in the Y direction. One write word line 14 and one read word lines 15 are paired and extended in the X direction. The Y selector 41 selects a selected write word line from the plurality of the write word lines 14 in write operations, and selects a selected read word line from the plurality of the read word lines 15 in read operations. The X selector 42 selects a selected bit line 13 from the plurality of the bit lines 13. The plurality of the memory elements 16 are provided at positions associated with respective intersections of the plurality of the bit lines 13 and the plurality of the write word lines 14 (the plurality of the read word lines 15).

The memory elements 16 are each comprised of the magnetoresistance element according to the present invention, in which the structure of No. "2" in FIG. 26 (FIG. 14) is used. As a comparative example, the structure of No. "1" in FIG. 26 is used. Copper interconnections are used as the write word lines 14, the read word lines 15 and the bit lines 13. Heat treatment of the Cu interconnections is conducted at 350° C. As shown in FIG. 18, a write operation in the MRAM prepared as stated above is carried out by flowing signal currents through the selected bit line 13 and the selected write word line 14 so as to generate a predetermined synthetic magnetic field at a position of a memory element 16. A signal is recorded in the target memory cell 16 by the synthetic magnetic field corresponding to the signal to be recorded. As shown in FIG. 19, a read operation is carried out by flowing a sense current through the selected bit line 13, the memory element 16 and the selected read word line 15 via a selected FET. A sense voltage (a voltage of the selected bit line) generated across the memory cell 16 by the magnetic resistance corresponding to the recorded signal is compared with a dummy voltage (a voltage of the bit line for a dummy element) generated across a dummy memory element by a comparator to detect the output of the memory element 16.

A result of verifying the write operation and the read operation as stated above proves that a good element output is obtained in the MRAM using the magnetoresistance element according to the present invention. However, in the MRAM using the magnetoresistance element of the comparative example, a sufficient element output is not obtained. This fact proves that the MRAM using the magnetoresistance element according to the present invention has sufficient heat resistance against the heat treatment at 350° C.

SIXTH EMBODIMENT

Figure 21:
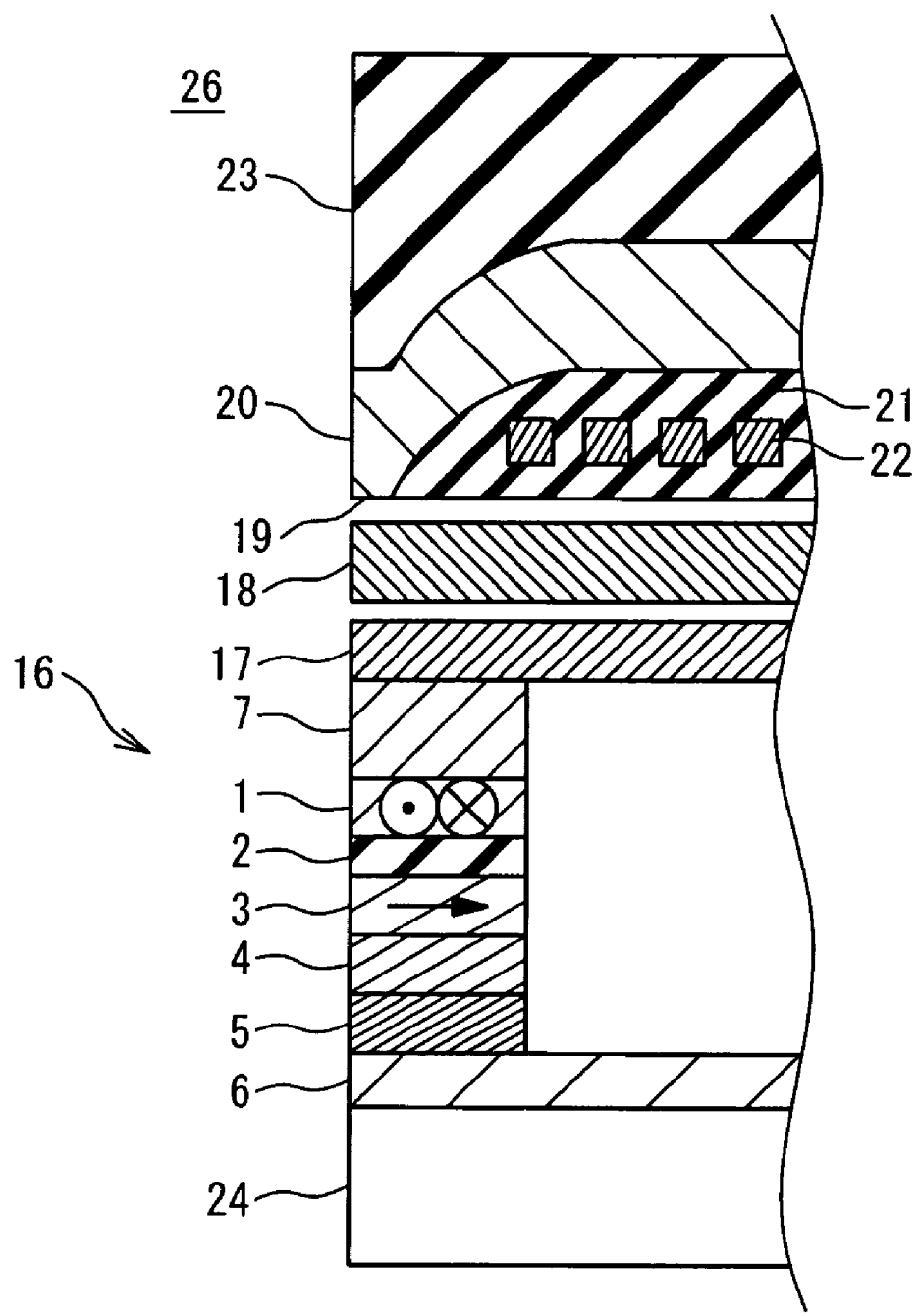
FIG. 21 is a cross sectional view showing the structure of the magnetoresistance element applied to a magnetic head as a reproducing element.

A magnetic head is prepared using the magnetoresistance element according to the present invention as a reproducing element. FIG. 21 is a cross sectional view showing the structure of the magnetoresistance element applied to the magnetic head as a reproducing element. The lower electrode layer 6, also used as a lower shield, is laminated on a ceramic substrate 24 which is used as a slider. A magnetoresistance element 16 is arranged between the lower electrode layer 6 and an upper shield 17. The reproducing element is comprised of the lower electrode layer 6, the magnetoresistance element 16, and the upper shield 17. Arranged on a side opposite to the reproducing element with respect to a first magnetic core 18 is a second magnetic core 20. A recording gap 19 is provided between the first magnetic core 18 and the second magnetic core 20. A coil 22 covered with a nonmagnetic insulating substance 21 is provided between the first magnetic core 18 and the second magnetic core 20. Recording is achieved by a magnetic flux leaking from the recording gap 19 between the first magnetic core 18 and the second magnetic core 20 magnetized by a magnetic field generated from the coil 22. A recording element is comprised of the first magnetic core 18 (the recording gap 19), the second magnetic core 20, the nonmagnetic insulating substance 21, and the coil 22. A magnetic head with the laminated structure of the reproducing element and the recording element is developed. The upper shield 17 and the first magnetic core 18 may be single-membered.

The reproducing element shown in FIG. 21 is formed on the insulating film substrate 24 composed of alumina formed on a complex ceramic of $Al_2O_3$—TiO which forms a slider. The lower electrode layer 6, which is also used as the lower shield, is formed by depositing a Co—Ta—Zr—Cr film (the film thickness is 1 μm, and the same applies hereinafter) by a sputtering method and patterning. Formed on the Co—Ta—Zr—Cr film in order by a sputtering method are an NiFeCr film (3 nm) as the foundation layer 5, a PtMn film (15 nm) as the antiferromagnetic layer 4, a film stack of $Co_{68}Fe_8Ta_{12}N_{12}$ (3 nm)/$Co_{90}Fe_{10}$ (1 nm)/Ru (0.8 nm)/$Co_{90}Fe_{10}$ (3 nm) as the fixed ferromagnetic layer 3, an Al—O film (0.5 nm) as the nonmagnetic layer 2, a film stack of $Co_{90}Fe_{10}$ (0.5 nm)/$Ni_{81}Fe_{19}$ (4 nm) as the free ferromagnetic layer 1, and a Ru film (10 nm) as the upper electrode layer 7. Film formation is conducted with an ultimate pressure of $7 \times 10^{-7}$ Pa, and an Ar sputtering gas pressure of 0.3 Pa. The sputtering electric power is set to 300 W. With respect to the Al—O film as the nonmagnetic layer 4, a metal aluminum is subjected to oxidization of the surface thereof through introducing pure oxygen into a sputtering device to sustain an oxygen pressure in a range of 10 mTorr to 200 Torr after the deposition of the metal aluminum, so that a tunnel barrier layer is formed. The magnetoresistance element formed as stated above is subjected to heat treatment at 250° C. for 5 hours in vacuum with a magnetic field of 1.3 T applied unidirectionally. The upper shield 17 is formed by depositing a Ni—Fe film (1 μm) by a flame plating method, followed by patterning. The reproducing element is thus formed.

Next, a Ni—Fe film (3 μm) is formed as the first magnetic core 18 by a flame plating method across an alumina film (nonmagnetic insulating film of 0.1 μm). The recording gap (magnetic gap) 19 is formed of aluminum, and the coil 22 used for generating a recording magnetic field is formed. The coil 22 is horizontally and vertically held by the nonmagnetic insulating material 21 of photoresist for insulation. The coil 22 is composed of Cu and formed by a flame plating method. A Ni—Fe film (4 μm) used as the second magnetic core 20 is then formed by a flame plating method. The recording element is thus formed. A stack structure of the above-described reproducing element and recording element is covered with an alumina film as a protection layer 23, and terminals (not shown) are provided outwards. The magnetic head 26 according to the present invention is thus prepared.

For a comparative example to the magnetic head stated above, a magnetic head as a comparative example is prepared in which the fixed ferromagnetic layer 3 is composed of a film stack of $Co_{90}Fe_{10}$ (3 nm)/Ru (0.8 nm)/$Co_{90}Fe_{10}$ (3 nm). The magnetic head 26 according to the present invention and the magnetic head as the comparative example are subjected to heat treatment at 350° C., and reproduction outputs before and after the heat treatment are compared. The result is that the magnetic head 26 according to the present invention exhibit substantially no output decrease after the heat treatment, while the magnetic head as the comparative example exhibits a decrease of about 10% after the heat treatment. This proves that the magnetic head 26 using the magnetoresistance element according to the present invention has sufficient heat resistance against the heat treatment at 350° C.

SEVENTH EMBODIMENT

Figure 22:
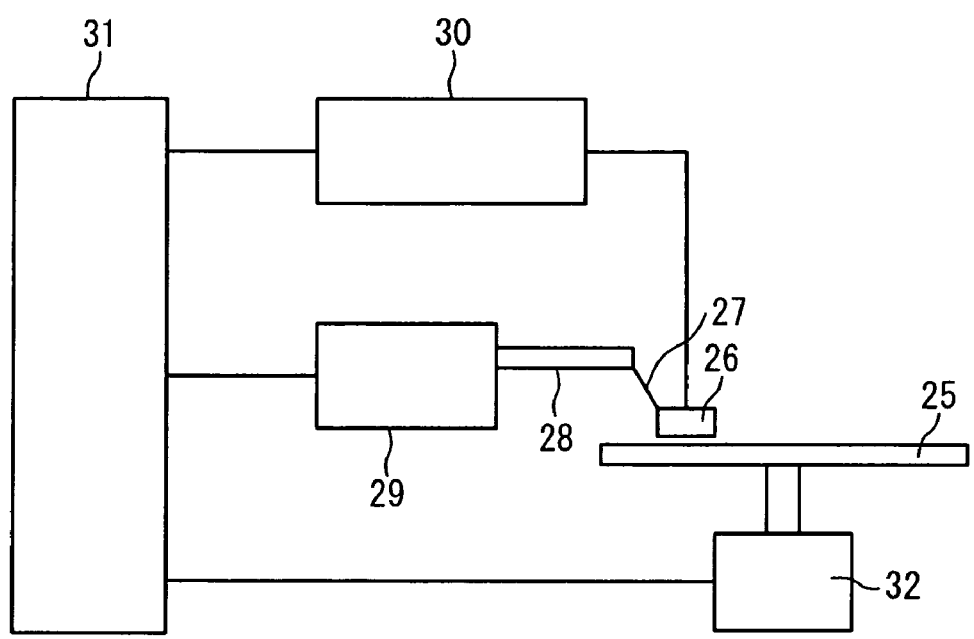
FIG. 22 is a block diagram showing the structure of a magnetic recording/reproducing device mounting the magnetic head containing the magnetoresistance element.

A magnetic recording/reproducing device is prepared which incorporates a magnetic head containing the magnetoresistance element according to the present invention. FIG. 22 is a block diagram showing the structure of the magnetic recording/reproducing device which incorporates the magnetic head containing the magnetoresistance element. A magnetic (recording) medium 25 is rotated by a driving motor 32. The magnetic head 26 according to the present invention is installed by a suspension 27 and an arm 28 so as to be opposed to a magnetic recording surface of the magnetic medium 25. This allows tracking by a voice coil motor (VCM) 29. A recording/reproducing operation is achieved by feeding a signal to the magnetic head 26 from a recording/reproducing channel 30. This recording/reproducing channel 30, the VCM 29, which determines the position of the magnetic head 26, and the driving motor 32, which rotates the magnetic medium 25, are operated in conjunction with one another by a control unit 31. The use of the magnetic head according to the present invention as the magnetic head 26 provides a stable magnetic recording device with tolerance to high temperature operation and heat.

The present invention provides a magnetoresistance element with high manufacturing yield and low manufacturing cost, in which characteristics thereof are not deteriorated by a heat treatment at 350° C. Additionally, the use of the magnetoresistance element provides an MRAM and a magnetic recording/reproducing head (magnetic head) with high heat resistance, high manufacturing yield and the low manufacturing cost. Furthermore, the use of the magnetic head provides a stable magnetic storage device with tolerance to high temperature operation and heat.

The invention claimed is:

1. A magnetoresistance element comprising:
   an antiferromagnetic layer formed on an upper surface side of a substrate;
   a fixed ferromagnetic layer formed on said antiferromagnetic layer;
   a first nonmagnetic layer formed on said fixed ferromagnetic layer; and
   a free ferromagnetic layer formed on said first nonmagnetic layer,
   wherein said fixed ferromagnetic layer is provided with an amorphous layer,
   wherein said amorphous layer contains amorphous material having a composition expressed by a chemical formula of X—Y—N,
   wherein X represents at least one element selected from Co, Fe and Ni,
   wherein Y represents at least one element selected from Al, Si, Mg, Ta, Nb, Zr, Hf, W, Mo, Ti and V, and
   wherein N represents nitrogen.

2. The magnetoresistance element according to claim 1, wherein said fixed ferromagnetic layer further includes:
   a first fixed ferromagnetic layer formed on said antiferromagnetic layer;
   a second nonmagnetic layer formed on said first fixed ferromagnetic layer; and
   a second fixed ferromagnetic layer formed on said second nonmagnetic layer.

3. The magnetoresistance element according to claim 2, wherein said amorphous layer is formed between said second nonmagnetic layer and said antiferromagnetic layer.

4. The magnetoresistance element according to claim 2, wherein said second nonmagnetic layer is a magnetization coupling layer designed so that magnetization directions of said first and second fixed ferromagnetic layers are fixed in opposite directions from each other.

5. The magnetoresistance element according to claim 1, wherein said amorphous layer further contains a compound having a composition expressed by a chemical formula of Y—N.

6. The magnetoresistance element according to claim 1, wherein said fixed ferromagnetic layer further includes a ferromagnetic layer.

7. The magnetoresistance element according to claim 6, wherein said amorphous layer is positioned between said ferromagnetic layer and said antiferromagnetic layer.

8. The magnetoresistance element according to claim 6, wherein said amorphous layer is positioned between said ferromagnetic layer and said first nonmagnetic layer.

9. The magnetoresistance element according to claim 1, wherein said fixed ferromagnetic layer further includes first and second ferromagnetic layers, and
   wherein said amorphous layer is positioned between said first and second ferromagnetic layers.

10. The magnetoresistance element according to claim 1, wherein said fixed ferromagnetic layer further includes:
    a ferromagnetic layer; and
    an additional amorphous layer,
    wherein said additional amorphous layer contains amorphous material having the composition expressed by the chemical formula of X—Y—N,
    wherein said amorphous layer is positioned between said ferromagnetic layer and said antiferromagnetic layer, and
    wherein said additional amorphous layer is positioned between said ferromagnetic layer and said first nonmagnetic layer.

11. The magnetoresistance element according to claim 1, wherein said fixed ferromagnetic layer further includes:
    a ferromagnetic layer; and
    a magnetization coupling layer positioned between said ferromagnetic layer and said amorphous layer and designed so that magnetization directions of said ferromagnetic layer and said amorphous layer are fixed in opposite directions from each other.

12. A magnetic random access memory comprising:
a plurality of bit lines extended in a first direction;
a plurality of word lines extended in a second direction substantially perpendicular to said first direction; and
magnetoresistance elements disposed at positions associated with respective intersections of said plurality of bit lines and said plurality of word lines;
wherein each of said magnetoresistance elements includes:
an antiferromagnetic layer formed on an upper surface side of a substrate;
a fixed ferromagnetic layer formed on said antiferromagnetic layer;
a first nonmagnetic layer formed on said fixed ferromagnetic layer; and
a free ferromagnetic layer formed on said first nonmagnetic layer,
wherein said fixed ferromagnetic layer is provided with an amorphous layer,
wherein said amorphous layer contains amorphous material having a composition expressed by a chemical formula of X—Y—N,
wherein X represents at least one element selected from Co, Fe and Ni,
wherein Y represents at least one element selected from Al, Si, Mg, Ta, Nb, Zr, Hf, W, Mo, Ti and V, and
wherein N represents nitrogen.

13. A magnetic head comprising:
a reproducing element;
a first magnetic core disposed apart from said reproducing element;
a second magnetic core disposed apart from said first magnetic core so as to form a predetermined gap on an opposite side of said reproducing element with respect to said first magnetic core; and
a coil disposed between said first magnetic core and said second magnetic core and separated therefrom by an insulating layer,
wherein said reproducing element includes:
two electrodes provided in a shield; and
a magnetoresistance element held between said two electrodes,
wherein said magnetoresistance element comprises:
an antiferromagnetic layer;
a fixed ferromagnetic layer formed on said antiferromagnetic layer;
a first nonmagnetic layer formed on said fixed ferromagnetic layer; and
a free ferromagnetic layer formed on said first nonmagnetic layer,
wherein said fixed ferromagnetic layer is provided with an amorphous layer,
wherein said amorphous layer contains amorphous material having a composition expressed by a chemical formula of X—Y—N,
wherein X represents at least one element selected from Co, Fe and Ni,
wherein Y represents at least one element selected from Al, Si, Mg, Ta, Nb, Zr, Hf, W, Mo, Ti and V, and
wherein N represents nitrogen.

14. A magnetic recording device comprising:
a motor rotating a magnetic recording medium;
a magnetic head for recording and reproducing data onto or from said magnetic recording medium;
a holding unit holding said magnetic head;
a moving unit moving said holding unit;
a recording/reproducing unit driving said magnetic head; and
a control unit controlling said moving unit and said recording/reproducing unit,
wherein said magnetic head includes:
a reproducing element;
a first magnetic core disposed apart from said reproducing element;
a second magnetic core disposed apart from said first magnetic core so as to form a predetermined gap on an opposite side of said reproducing element with respect to said first magnetic core; and
a coil disposed between said first magnetic core and said second magnetic core and separated therefrom by an insulating layer,
wherein said reproducing element comprises:
two electrodes provided in a shield; and
a magnetoresistance element held between said two electrodes,
wherein said magnetoresistance element includes:
an antiferromagnetic layer;
a fixed ferromagnetic layer formed on said antiferromagnetic layer;
a first nonmagnetic layer formed on said fixed ferromagnetic layer; and
a free ferromagnetic layer formed on said first nonmagnetic layer,
wherein said fixed ferromagnetic layer is provided with an amorphous layer,
wherein said amorphous layer contains amorphous material having a composition expressed by a chemical formula of X—Y—N,
wherein X represents at least one element selected from Co, Fe and Ni,
wherein Y represents at least one element selected from Al, Si, Mg, Ta, Nb, Zr, Hf, W, Mo, Ti and V, and
wherein N represents nitrogen.

* * * * *